United States Patent
Nishido et al.

(10) Patent No.: US 9,258,853 B2
(45) Date of Patent: Feb. 9, 2016

(54) LIGHT-EMITTING DEVICE, ELECTRONIC DEVICE, LIGHTING DEVICE, AND METHOD FOR MANUFACTURING THE LIGHT-EMITTING DEVICE

(75) Inventors: Yusuke Nishido, Isehara (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 35 days.

(21) Appl. No.: 13/591,445

(22) Filed: Aug. 22, 2012

(65) Prior Publication Data

US 2013/0048967 A1 Feb. 28, 2013

(30) Foreign Application Priority Data

Aug. 26, 2011 (JP) .................. 2011-184779

(51) Int. Cl.
| | |
|---|---|
| H01L 51/00 | (2006.01) |
| H01L 29/08 | (2006.01) |
| H05B 33/04 | (2006.01) |
| H01L 51/52 | (2006.01) |
| H01L 51/50 | (2006.01) |
| H01L 27/32 | (2006.01) |

(52) U.S. Cl.
CPC ............ *H05B 33/04* (2013.01); *H01L 51/5246* (2013.01); *H01L 51/5259* (2013.01); *H01L 27/322* (2013.01); *H01L 27/3244* (2013.01); *H01L 51/5068* (2013.01); *H01L 2251/566* (2013.01)

(58) Field of Classification Search
CPC . H01L 51/5237; H01L 27/3244; C09K 11/06
See application file for complete search history.

(56) References Cited

U.S. PATENT DOCUMENTS

| | | |
|---|---|---|
| 6,113,450 A | 9/2000 | Narayanan et al. |
| 6,646,284 B2 | 11/2003 | Yamazaki et al. |
| 6,803,246 B2 | 10/2004 | Yamazaki et al. |

(Continued)

FOREIGN PATENT DOCUMENTS

| | | |
|---|---|---|
| CN | 102450098 A | 5/2012 |
| EP | 2 442 621 A1 | 4/2012 |

(Continued)

OTHER PUBLICATIONS

International Search Report re application No. PCT/JP2012/070285, dated Nov. 20, 2012.

(Continued)

*Primary Examiner* — Whitney T Moore
*Assistant Examiner* — Joseph Galvin, III
(74) *Attorney, Agent, or Firm* — Husch Blackwell LLP

(57) ABSTRACT

A light-emitting device in which deterioration of an organic EL element due to impurities such as moisture or oxygen is suppressed is provided. The light-emitting device includes a first substrate and a second substrate facing each other, a light-emitting element provided over the first substrate, a first sealant provided so as to surround the light-emitting element, and a second sealant provided so as to surround the first sealant. One of the first sealant and the second sealant is a glass layer and the other is a resin layer. A dry agent is provided in a first space surrounded by the first sealant, the second sealant, the first substrate, and the second substrate, or in the resin layer. The light-emitting element is included in a second space surrounded by the first sealant, the first substrate, and the second substrate.

14 Claims, 13 Drawing Sheets

(56) References Cited

U.S. PATENT DOCUMENTS

| | | | |
|---|---|---|---|
| 6,860,780 B2 | 3/2005 | Miyashita et al. | |
| 6,903,800 B2 | 6/2005 | Onishi et al. | |
| 6,984,159 B1 | 1/2006 | Kado et al. | |
| 7,121,642 B2 | 10/2006 | Stoessel et al. | |
| 7,407,423 B2 | 8/2008 | Aitken et al. | |
| 7,431,628 B2 | 10/2008 | Park et al. | |
| 7,602,121 B2 | 10/2009 | Aitken et al. | |
| 7,701,136 B2 | 4/2010 | Kwak | |
| 7,780,493 B2 | 8/2010 | Choi et al. | |
| 7,837,530 B2 | 11/2010 | Park | |
| 7,868,540 B2 | 1/2011 | Kim | |
| 7,871,949 B2 | 1/2011 | Lee et al. | |
| 7,944,143 B2 | 5/2011 | Choi et al. | |
| 8,063,560 B2 | 11/2011 | Aitken et al. | |
| 8,125,146 B2 | 2/2012 | Park | |
| 8,164,257 B2 | 4/2012 | Choi et al. | |
| 2004/0207314 A1 | 10/2004 | Aitken et al. | |
| 2007/0170854 A1 | 7/2007 | Kwak | |
| 2007/0172971 A1* | 7/2007 | Boroson | H01L 51/5246 438/26 |
| 2007/0200491 A1* | 8/2007 | Seo | H01L 27/3246 313/504 |
| 2007/0200835 A1 | 8/2007 | Choo et al. | |
| 2010/0078646 A1 | 4/2010 | Sumita et al. | |
| 2010/0096984 A1 | 4/2010 | Kim | |
| 2010/0244057 A1* | 9/2010 | Ryu | H01L 51/525 257/88 |
| 2010/0327275 A1* | 12/2010 | Saito | C09K 11/06 257/40 |
| 2011/0186869 A1* | 8/2011 | Hong | H01L 51/56 257/88 |
| 2012/0080671 A1* | 4/2012 | Niboshi | H01L 51/524 257/40 |

FOREIGN PATENT DOCUMENTS

| | | |
|---|---|---|
| JP | 10-134959 | 5/1998 |
| JP | 11-329717 | 11/1999 |
| JP | 2000-208251 | 7/2000 |
| JP | 2002-158088 | 5/2002 |
| JP | 2003-297558 | 10/2003 |
| JP | 2006-210095 | 8/2006 |
| JP | 2007-35322 | 2/2007 |
| JP | 2007-52395 | 3/2007 |
| JP | 2007-140061 | 6/2007 |
| JP | 2011-18479 | 1/2011 |
| JP | 2011-54477 | 3/2011 |
| JP | 2011-65895 | 3/2011 |
| JP | 2011-70797 | 4/2011 |
| KR | 10-2012-0024658 | 3/2012 |
| WO | WO 2010/143337 A1 | 12/2010 |

OTHER PUBLICATIONS

Written Opinion re application No. PCT/JP2012/070285, dated Nov. 20, 2012.

* cited by examiner

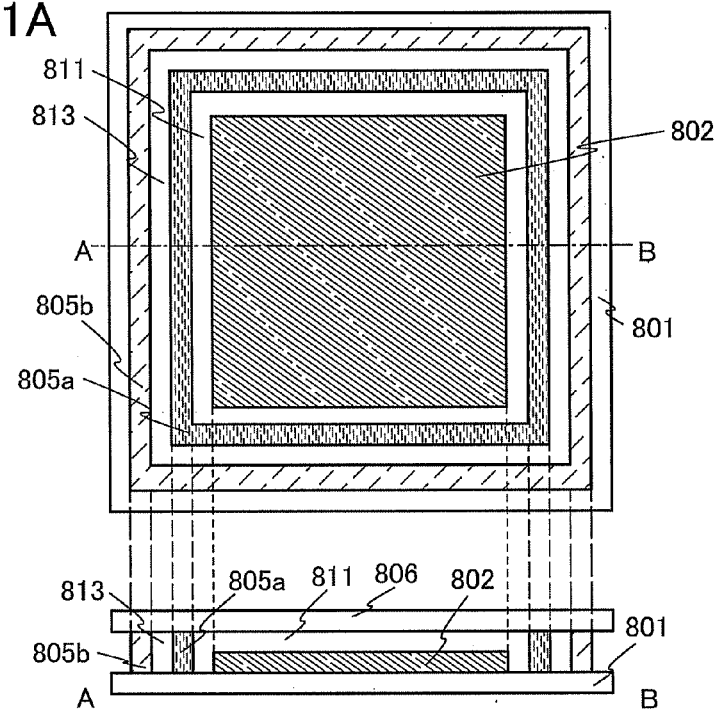
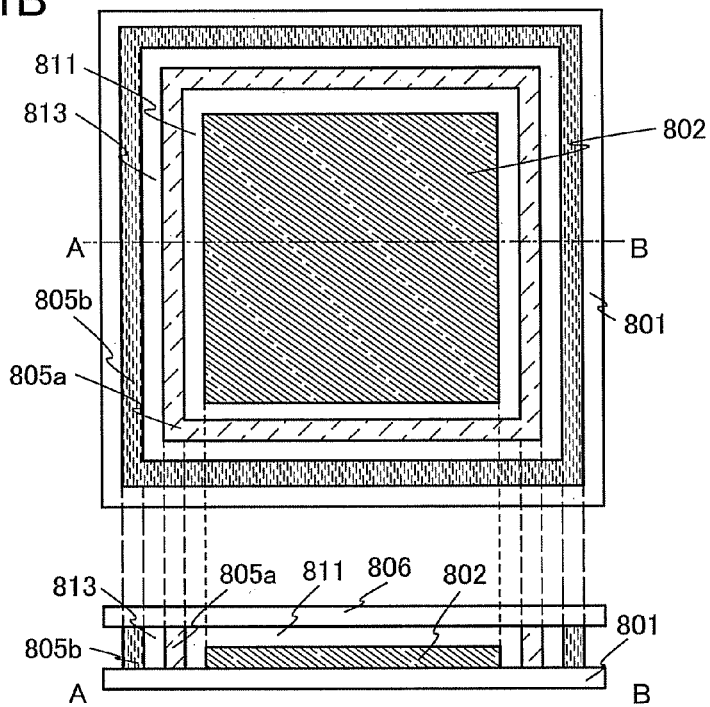

FIG. 10A1
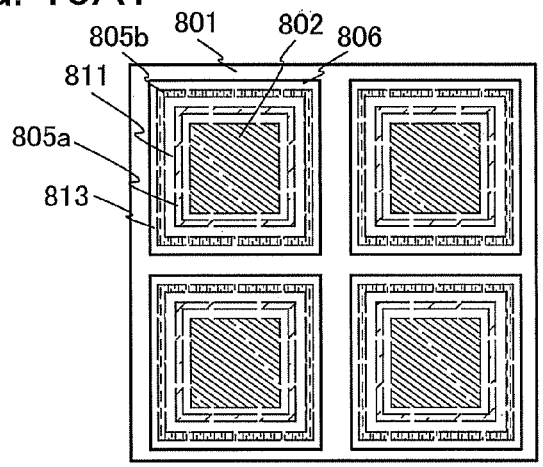
FIG. 10A2
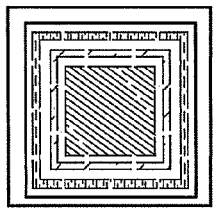
FIG. 10B1
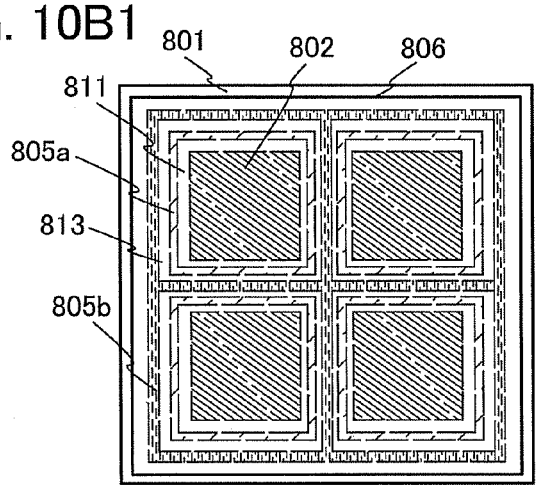
FIG. 10B2
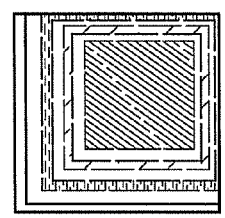
FIG. 10C1
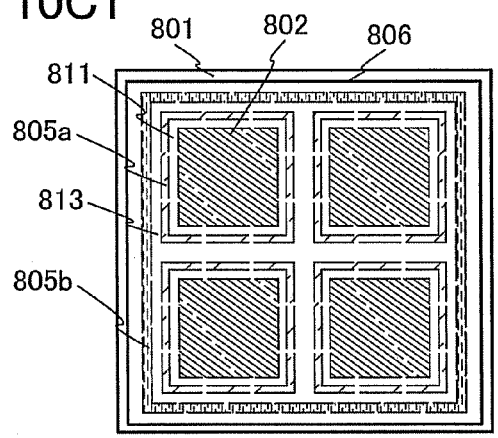
FIG. 10C2
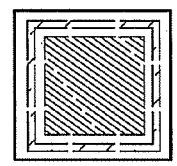

FIG. 13A1 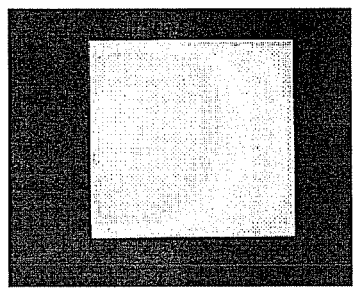
FIG. 13A2 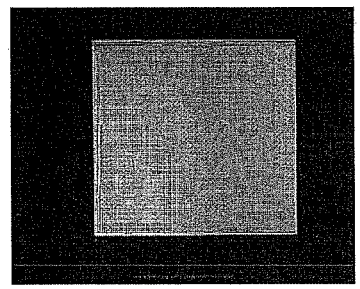
FIG. 13B1 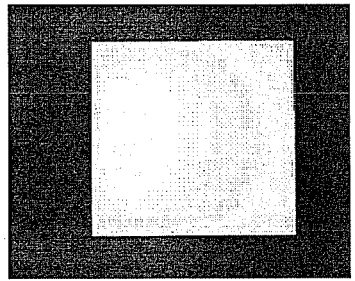
FIG. 13B2 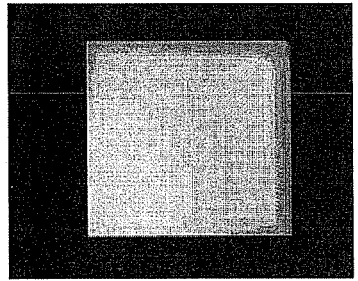
FIG. 13C1 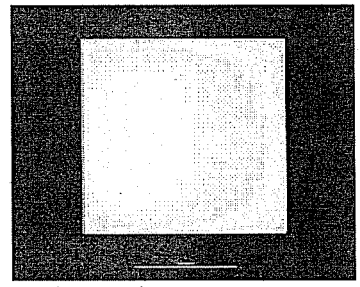
FIG. 13C2 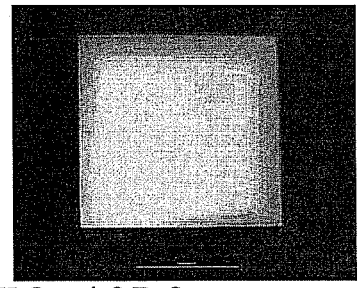
FIG. 13D1 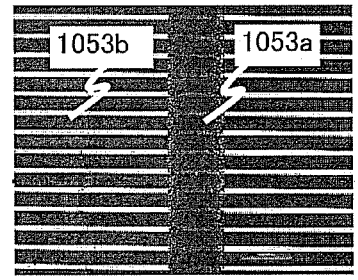
FIG. 13D2 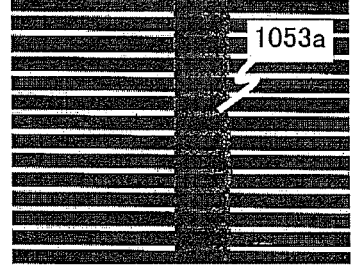

LIGHT-EMITTING DEVICE, ELECTRONIC DEVICE, LIGHTING DEVICE, AND METHOD FOR MANUFACTURING THE LIGHT-EMITTING DEVICE

TECHNICAL FIELD

The present invention relates to a light-emitting device, an electronic device, and a lighting device each using organic electroluminescence (EL). The present invention also relates to a method for manufacturing the light-emitting device.

BACKGROUND ART

A light-emitting element (also referred to as an organic EL element) using organic EL has been actively researched and developed. In the fundamental structure of an organic EL element, a layer containing a light-emitting organic compound is provided between a pair of electrodes. By voltage application to this element, light emission from the light-emitting organic compound can be obtained.

An organic EL element, which has characteristics such as feasibility of being thinner and lighter, high speed response to input signals, and capability of direct current low voltage driving, has been expected to be applied to next-generation flat panel displays or lighting devices. In particular, a display device in which organic EL elements are arranged in matrix is considered to have advantages of a wide viewing angle and excellent visibility over a conventional liquid crystal display device.

However, an organic EL element has a problem in that entry of impurities such as moisture or oxygen from the outside erodes the reliability.

When impurities such as moisture or oxygen enter an organic compound or a metal material contained in an organic EL element from the outside of the organic EL element, the lifetime of the organic EL element is significantly shortened in some cases. This is because an organic compound or a metal material contained in the organic EL element reacts with the impurities such as moisture or oxygen and thus deteriorates.

Thus, a technique to seal an organic EL element for preventing entry of impurities has been researched and developed.

An organic EL element can be sealed with a thin film, glass using glass frit or the like, or a resin, for example. The technique to seal an organic EL element with a thin film has problems such as high cost and low productivity. The sealing property of a resin is lower than that of glass and it is difficult to completely block impurities such as moisture or oxygen. In contrast, it is considered that a technique to seal an organic EL element with a pair of substrates and glass using glass frit or the like is a preferable sealing method because of its low cost and high productivity.

For example, a glass package sealed by attaching a first glass plate to a second glass plate with frit, which can be applied to seal an organic EL element, is disclosed in Patent Document 1.

REFERENCE

[Patent Document 1] U.S. published patent application No. 2004/0207314

DISCLOSURE OF INVENTION

However, in a light-emitting device whose organic EL element is sealed with a pair of glass substrates and glass frit, a sufficient effect of sealing cannot be obtained in some cases because the strength of a glass layer formed with the glass frit is not sufficient or the adhesion strength of the glass frit to a material in contact with the glass frit is not sufficient.

For example, glass frit is generally irradiated with a laser and melted, so that the glass frit is adhered to a substrate. By heat generated at this time, a residual strain is generated in a glass layer formed with the glass frit. In the manufacturing process of the light-emitting device, part of the glass layer might be separated from the substrate or breaking or cracking (hereinafter, collectively referred to as a crack) might be generated in the glass layer by stress in the glass layer caused by the residual strain. In some cases, the stress is concentrated in a surface of the glass substrate to cause a crack in the glass substrate.

When part of the glass layer is separated from the substrate or a crack is generated in the glass layer or the glass substrate in the manufacturing process, the effect of sealing is reduced. Thus, an organic compound or a metal material contained in the organic EL element reacts with impurities such as moisture or oxygen which enter from the outside of the light-emitting device and thus deteriorates.

Accordingly, one object of one embodiment of the present invention is to provide a light-emitting device which is capable of suppressing deterioration of an organic EL element due to impurities such as moisture or oxygen.

One object of one embodiment of the present invention is to provide a highly reliable electronic device or a highly reliable lighting device, including the light-emitting device.

One object of one embodiment of the present invention is to provide a method for manufacturing a light-emitting device which is capable of suppressing entry of impurities such as moisture or oxygen.

A light-emitting device of one embodiment of the present invention has the following structure: glass having excellent productivity and an excellent sealing property, and a resin having excellent impact resistance and excellent heat resistance, which is not easily broken by deformation due to external force or the like, are used to seal an organic EL element with a pair of substrates. Further, a dry agent is provided in a space surrounded by the pair of substrates, the glass, and the resin or contained in the resin.

Specifically, one embodiment of the present invention is a light-emitting device including a first substrate and a second substrate which face each other, a light-emitting element provided over the first substrate, a first sealant provided so as to surround the light-emitting element, and a second sealant provided so as to surround the first sealant. The light-emitting element includes a layer containing a light-emitting organic compound between a pair of electrodes. One of the first sealant and the second sealant is a glass layer and the other of the first sealant and the second sealant is a resin layer. A dry agent is provided in a first space surrounded by the first sealant, the second sealant, the first substrate, and the second substrate. The light-emitting element is provided in a second space surrounded by the first sealant, the first substrate, and the second substrate.

One embodiment of the present invention is a light-emitting device including a first substrate and a second substrate which face each other, a light-emitting element provided over the first substrate, a first sealant provided so as to surround the light-emitting element, and a second sealant provided so as to surround the first sealant. The light-emitting element includes a layer containing a light-emitting organic compound between a pair of electrodes. One of the first sealant and the second sealant is a glass layer and the other of the first sealant and the second sealant is a resin layer. A dry agent is included in the resin layer and the light-emitting element is provided in a space surrounded by the first sealant, the first substrate, and the second substrate.

Note that in this specification, the first sealant and the second sealant are not necessarily in contact with the first substrate and the second substrate. The first sealant may be in contact with a first film formed over the first substrate or a second film formed over the second substrate, for example.

In the above light-emitting device of one embodiment of the present invention, one of the first sealant and the second sealant is the glass layer and the other is the resin layer. In addition, the dry agent is provided in the space (hereinafter, referred to as the first space) surrounded by the first sealant, the second sealant, the first substrate, and the second substrate, or contained in the resin layer.

In one embodiment of the present invention, the glass layer, which has a high effect of sealing, is used as the sealant. In addition, the resin layer, which has better impact resistance and heat resistance than the glass layer and is not easily broken by deformation due to external force or the like, is used as the other sealant, in one embodiment of the present invention.

Owing to the resin layer, which has excellent impact resistance and excellent heat resistance and is not easily broken by deformation due to external force or the like and is used as the other sealant, deformation of the light-emitting device due to external force or the like can be suppressed. Accordingly, generation of a crack in the glass layer used as the sealant or the substrate can be suppressed.

Further, the resin layer is less likely to be separated from the substrate or a crack is less likely to be generated in the resin layer in the manufacturing process or in use of the light-emitting device, so that the effect of sealing the organic EL element with the resin layer is less likely to be reduced. Thus, even when part of the glass layer is separated from the substrate or a crack is generated in the glass layer in the manufacturing process or in use of the light-emitting device and the effect of sealing the organic EL element with the glass layer is not sufficiently obtained, the effect of sealing the organic EL element with the resin layer is maintained in the light-emitting device of one embodiment of the present invention.

Furthermore, since the dry agent is provided in the first space or in the resin layer, entry of impurities such as moisture or oxygen into the space (hereinafter also referred to as the second space) surrounded by the pair of substrates and the first sealant can be suppressed.

When impurities such as moisture or oxygen enter the second space, the moisture or oxygen enters the organic EL element. Even when a dry agent is provided in the second space, moisture or oxygen is adsorbed by the dry agent and at the same time (concurrently), moisture or oxygen enters the organic EL element.

However, in one embodiment of the present invention, the dry agent is provided in the first space or in the resin layer. In the case where the dry agent is provided in the first space, impurities such as moisture or oxygen are adsorbed by the dry agent provided in the first space even when the sealing property of the second sealant is insufficient and thus the impurities enter the first space. As a result, entry of the impurities into the second space can be suppressed. In the case where the dry agent is contained in the resin layer, the sealing property of the resin layer can be improved and thus, entry of impurities such as moisture or oxygen into the second space (and the first space in the case where the resin layer containing the dry agent is the second sealant) can be suppressed. As a result, an organic compound or a metal material contained in the organic EL element can be prevented from reacting with impurities such as moisture or oxygen which enter the organic EL element and deteriorating.

When the light-emitting device has the structure in which the dry agent is contained in the resin layer, the size of the light-emitting device and the area other than the light-emitting region (i.e., the area of the frame) can be further reduced compared to the structure in which the dry agent is provided in the first space. In addition, for example, a step of providing a depressed portion for providing a dry agent over the substrate is not necessary, so that cost reduction and simplification of the manufacturing process can be achieved.

The light-emitting device preferably has a structure in which the first sealant is the glass layer and the second sealant is the resin layer.

In the light-emitting device, distortion due to external force or the like increases toward the peripheral portion. Thus, in the first sealant and the second sealant provided so as to surround the first sealant, the glass layer can be used as the first sealant, where distortion due to external force or the like is relatively small, so that the sealing property of the glass layer can be prevented from being insufficient. In addition, the second sealant can be the resin layer, which has excellent impact resistance and excellent heat resistance and is not easily broken by deformation due to external force or the like; thus, entry of moisture or oxygen into the first space can be suppressed by the sealing property of the resin and by the dry agent included in the first space or contained in the resin layer. Accordingly, even when the sealing property of the glass layer is insufficient, entry of moisture or oxygen into the second space (or the organic EL element) can be suppressed.

In the light-emitting device, a resin contained in the resin layer is preferably a photocurable resin. A photocurable resin, which is cured by light irradiation, is preferably used because change in film quality and deterioration of an organic EL material itself caused when the organic EL element is heated can be suppressed.

One embodiment of the present invention is an electronic device including the light-emitting device. One embodiment of the present invention is a lighting device including the light-emitting device. In the light-emitting device, deterioration of the organic EL element due to impurities such as moisture or oxygen can be suppressed. Thus, a highly reliable electronic device or a highly reliable lighting device can be provided.

One embodiment of the present invention is a method for manufacturing a light-emitting device, including a first step, a second step, a third step, a fourth step, and a fifth step in that order. In the first step, a first electrode, a layer containing a light-emitting organic compound, and a second electrode are provided in that order over a first substrate to form a light-emitting element, whereby a light-emitting portion is formed. In the second step, a fit paste is applied over a second substrate and then is heated to form a glass layer. In the third step, a photocurable resin containing a dry agent is applied over the second substrate in an inert atmosphere to form a resin layer. In the fourth step, the first substrate and the second substrate are provided so as to face each other and the resin layer is irradiated with light under reduced pressure, so that a closed space surrounded by the resin layer, the first substrate, and the second substrate is formed. In the fifth step, the glass layer is irradiated with laser light in the air, so that a closed space surrounded by the glass layer, the first substrate, and the second substrate is formed. The glass layer is provided so as to surround the light-emitting portion and the resin layer is provided so as to surround the glass layer.

In the method for manufacturing a light-emitting device, the fifth step is performed in the air. It is preferable in that a laser irradiation apparatus does not necessarily has a complicated structure (a laser irradiation apparatus with a simple structure can be used).

In general, the sealing property of a glass layer is insufficient before the glass layer is irradiated with laser light. Thus, deterioration of an organic EL element due to impurities occurs when a light-emitting device is exposed to the air. In contrast, the fourth step is performed in one embodiment of the present invention, so that the organic EL element is sufficiently sealed with the photocurable resin containing the dry agent and the pair of substrates. Accordingly, entry of impurities such as moisture or oxygen into the light-emitting element to deteriorate the light-emitting element can be suppressed even when the fifth step is performed in the air.

Further, in the method for manufacturing a light-emitting device, the fourth step is performed under reduced pressure. With the fourth step performed under reduced pressure, the space where the organic EL element is sealed with the photocurable resin containing the dry agent and the pair of substrates keeps its reduced pressure. Thus, the state where pressure is applied to the pair of substrates by atmospheric pressure is maintained in the fifth step performed in the air, so that laser light irradiation can be performed without providing any other pressure application.

As a result, in the above-described light-emitting device of one embodiment of the present invention, the second space (space surrounded by the first sealant, the first substrate, and the second substrate) is preferably under reduced pressure.

In one embodiment of the present invention, a light-emitting device which is capable of suppressing deterioration of an organic EL element due to impurities such as moisture or oxygen can be provided.

In one embodiment of the present invention, a highly reliable electronic device or a highly reliable lighting device, including the light-emitting device can be provided.

In one embodiment of the present invention, a method for manufacturing a light-emitting device which is capable of suppressing entry of impurities such as moisture or oxygen can be provided.

BRIEF DESCRIPTION OF DRAWINGS

FIGS. 1A and 1B illustrate light-emitting devices of one embodiment of the present invention.

FIGS. 10A1, 10A2, 10B1, 10B2, 10C1, and 10C2 illustrate light-emitting devices of one embodiment of the present invention.

FIGS. 13A1, 13A2, 13B1, 13B2, 13C1, 13C2, 13D1, and 13D2 show results in Example.

BEST MODE FOR CARRYING OUT THE INVENTION

Figure 2A:
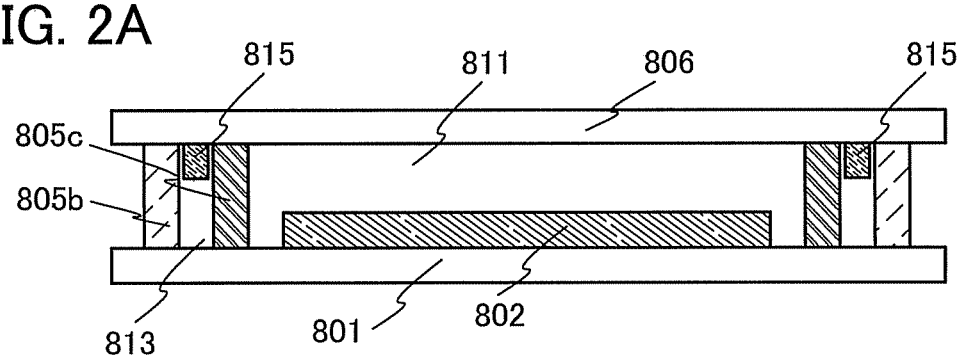
FIGS. 2A and 2B illustrate light-emitting devices of one embodiment of the present invention.

Embodiments and an example will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments and the example. Note that in structures of the present invention described below, the same portions or portions having similar functions are denoted by the same reference numerals in different drawings, and a description thereof is not repeated.

Embodiment 1

In this embodiment, light-emitting devices of one embodiment of the present invention will be described with reference to FIGS. 1A and 1B and FIGS. 2A and 2B.

The light-emitting device of one embodiment of the present invention includes one or more light-emitting elements between a first substrate and a second substrate which face each other. The light-emitting element includes a layer containing a light-emitting organic compound (hereinafter referred to as an EL layer) between a pair of electrodes. The light-emitting element is sealed with a first sealant which is provided along the peripheries of the first substrate and the second substrate to surround the light-emitting element. Further, the light-emitting element is sealed with a second sealant which is provided along the peripheries of the first substrate and the second substrate to surround the first sealant. One of the first sealant and the second sealant is a glass layer and the other is a resin layer. In addition, a dry agent is provided in a space (hereinafter referred to as a first space) surrounded by the first sealant, the second sealant, the first substrate, and the second substrate or contained in the resin layer.

In one embodiment of the present invention, the glass layer, which has a high effect of sealing, and the resin layer, which has better impact resistance and heat resistance than the glass layer and is not easily broken by deformation due to external force or the like, are used as the sealants.

Owing to the resin layer, which has excellent impact resistance and excellent heat resistance and is not easily broken by deformation due to external force or the like and is used as one of the sealants, deformation of the light-emitting device due to external force or the like can be suppressed. Accordingly, generation of a crack in the glass layer used as the other of the sealants or the substrate can be suppressed.

Further, the resin layer is less likely to be separated from the substrate or a crack is less likely to be generated in the resin layer in the manufacturing process or in use of the light-emitting device, so that the effect of sealing the organic EL element with the resin layer is less likely to be reduced. Thus, even when part of the glass layer is separated from the substrate or a crack is generated in the glass layer or the substrate in the manufacturing process or in use of the light-emitting device and the effect of sealing the organic EL element with the glass layer is not sufficiently obtained, the effect of sealing the organic EL element with the resin layer is maintained in the light-emitting device of one embodiment of the present invention.

Furthermore, since the dry agent is provided in the first space or in the resin layer, entry of impurities such as moisture or oxygen into a space (hereinafter referred to as a second space) surrounded by the pair of substrates and the first sealant can be suppressed.

Here, the case where a dry agent is neither provided in the first space nor in the resin layer but provided in the second space is described. The sealing property of the glass layer, which is the first sealant or the second sealant, might be insufficient because a crack is generated in the manufacturing process of the light-emitting device, for example. Although the resin layer which is the first sealant or the second sealant (the sealant which is not the glass layer) and does not contain a dry agent has a sealing property, the sealing property is lower than that of the glass layer. Since a dry agent is not provided in the first space, more than a little moisture or oxygen probably enters the second space. In the second space at this time, moisture or oxygen is adsorbed by the dry agent and at the same time (concurrently), moisture or oxygen enters the organic EL element.

However, in the light-emitting device of one embodiment of the present invention, the dry agent is provided in the first space or in the resin layer. In the case where the dry agent is provided in the first space, impurities such as moisture or oxygen are adsorbed by the dry agent provided in the first space even when the sealing property of the second sealant is insufficient and thus the impurities enter the first space. As a result, entry of the impurities into the second space can be suppressed. In the case where the dry agent is contained in the resin layer, the sealing property of the resin layer can be improved and thus, entry of impurities such as moisture or oxygen into the second space (and the first space in the case where the resin layer containing the dry agent is the second sealant) can be suppressed. As a result, an organic compound or a metal material contained in the organic EL element can be prevented from reacting with impurities such as moisture or oxygen which enter the organic EL element and deteriorating.

Structural Example of Light-Emitting Device of the Present Invention

Structural Example 1

FIG. 1A illustrates a plan view of a light-emitting device of one embodiment of the present invention. FIG. 1A also illustrates a cross-sectional view taken along dashed-dotted line A-B in the plan view.

The light-emitting device illustrated in FIG. 1A includes a light-emitting portion 802 including a light-emitting element over a first substrate 801. In the light-emitting device, a first sealant 805*a* is provided so as to surround the light-emitting portion 802 and a second sealant 805*b* is provided so as to surround the first sealant 805*a*.

The light-emitting portion 802 is sealed with the first substrate 801, a second substrate 806, and the first sealant 805*a*, and with the first substrate 801, the second substrate 806, and the second sealant 805*b*.

Note that in this specification, as described above, the first sealant and the second sealant are not necessarily in contact with the first substrate and the second substrate. The first sealant 805*a* may be in contact with an insulating film or a conductive film formed over the first substrate 801, for example.

In the light-emitting device illustrated in FIG. 1A, the first sealant 805*a* is a resin layer containing a dry agent and the second sealant 805*b* is a glass layer. Since the dry agent is contained in the resin layer, the sealing property of the first sealant 805*a* is sufficiently high.

With the resin layer, generation of a crack in the glass layer can be suppressed. As described above, in the case where a sufficient effect of sealing the light-emitting element with the glass layer, which is the second sealant 805*b*, cannot be obtained, entry of impurities such as moisture or oxygen into a second space 811 can be suppressed owing to a high sealing property of the first sealant 805*a* even when impurities such as moisture or oxygen enter a first space 813. As a result, an organic compound or a metal material contained in the organic EL element can be prevented from reacting with impurities such as moisture or oxygen which enter the organic EL element and deteriorating.

Further, since the first sealant 805*a* is provided, even when degassing from the glass layer, which is the second sealant 805*b*, occurs, entry of the gas into the second space 811 (or the organic EL element) can be suppressed.

Structural Example 2

FIG. 1B illustrates a plan view of a light-emitting device of one embodiment of the present invention. FIG. 1B also illustrates a cross-sectional view taken along dashed-dotted line A-B in the plan view.

The light-emitting device illustrated in FIG. 1B is similar to the light-emitting device in Structural Example 1, except that the first sealant 805*a* is the glass layer and the second sealant 805*b* is the resin layer containing the dry agent.

The light-emitting device illustrated in FIG. 1B includes the dry agent in the resin layer; thus, the sealing property of the second sealant 805*b* is sufficiently high. Accordingly, entry of impurities such as moisture or oxygen into the first space 813 and the second space 811 can be suppressed. As a result, an organic compound or a metal material contained in the organic EL element can be prevented from reacting with impurities such as moisture or oxygen which enter the organic EL element and deteriorating.

In the light-emitting device, distortion due to external force or the like increases toward the peripheral portion. Thus, in the first sealant 805*a* and the second sealant 805*b* provided so as to surround the first sealant 805*a*, the glass layer can be used as the first sealant 805*a*, where distortion due to external force or the like is relatively small, so that the sealing property of the glass layer can be prevented from being insufficient. In addition, the second sealant 805*b* can contain the dry agent and the resin, which has excellent impact resistance and excellent heat resistance and is not easily broken by deformation due to external force or the like; thus, entry of moisture or oxygen into the first space 813 can be suppressed. Accordingly, even when the sealing property of the glass layer is insufficient, entry of moisture or oxygen into the second space 811 (or the light-emitting portion 802 or the light-emitting element) can be suppressed.

Although the dry agent is contained in the resin layer which is used as the sealant in Structural Example 1 and Structural Example 2, the present invention is not limited thereto. A dry agent may be provided in the first space as in Structural Example 3 and Structural Example 4 described later.

Since the dry agent is contained in the resin layer in Structural Example 1 and Structural Example 2, the size of the light-emitting device and the area other than the light-emitting region (i.e., the area of the frame) can be further reduced compared to Structural Example 3 and Structural Example 4 described later. In addition, a depressed portion or the like for providing a dry agent in the first space 813 is not necessarily formed, so that cost reduction and simplification of the manufacturing process can be achieved.

Structural Example 3

FIG. 2A is a cross-sectional view of a light-emitting device of one embodiment of the present invention.

The light-emitting device illustrated in FIG. 2A is similar to the light-emitting device in Structural Example 1, except that a first sealant 805*c* is a resin layer which does not contain a dry agent and the first space 813 includes a dry agent 815.

The light-emitting portion 802 is sealed with the first substrate 801, the second substrate 806, and the first sealant 805*c*, and with the first substrate 801, the second substrate 806, and the second sealant 805*b*.

When a sufficient effect of sealing the light-emitting element with the glass layer, which is the second sealant 805*b*, cannot be obtained and impurities such as moisture or oxygen enter the first space 813, the impurities such as moisture or oxygen are adsorbed by the dry agent 815 included in the first space 813. Thus, entry of the impurities into the second space 811 through the first sealant 805*c* can be suppressed. As a result, an organic compound or a metal material contained in the organic EL element can be prevented from reacting with impurities such as moisture or oxygen which enter the organic EL element and deteriorating.

Further, since the dry agent 815 is included in the first space 813, even when degassing from the glass layer, which is the second sealant 805*b*, occurs, entry of the gas into the second space 811 (or the organic EL element) can be suppressed.

Structural Example 4

Figure 2B:
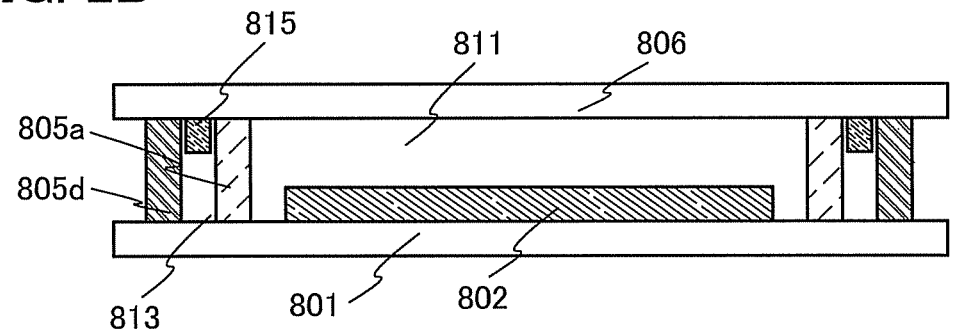

FIG. 2B is a cross-sectional view of a light-emitting device of one embodiment of the present invention.

The light-emitting device illustrated in FIG. 2B is similar to the light-emitting device in Structural Example 2, except that a second sealant 805*d* is a resin layer which does not contain a dry agent and the first space 813 includes the dry agent 815.

The light-emitting portion 802 is sealed with the first substrate 801, the second substrate 806, and the first sealant 805*a*, and with the first substrate 801, the second substrate 806, and the second sealant 805*d*.

As described above, in the light-emitting device, distortion due to external force or the like increases toward the peripheral portion. Thus, in the first sealant 805*a* and the second sealant 805*d* provided so as to surround the first sealant 805*a*, the glass layer can be used as the first sealant 805*a*, where distortion due to external force or the like is relatively small, so that the sealing property of the glass layer can be prevented from being insufficient. In addition, the resin layer, which has excellent impact resistance and excellent heat resistance and is not easily broken by deformation due to external force or the like, can be used as the second sealant 805*d*; thus, the sealing property of the second sealant 805*d* can be maintained.

Even when impurities such as moisture or oxygen enter the first space 813 through the second sealant 805*d*, the impurities are adsorbed by the dry agent 815 included in the first space 813. As a result, fewer impurities are contained in the first space 813, and thus even when the sealing property of the glass layer is insufficient, entry of the impurities into the second space 811 (or the light-emitting portion 802 or the light-emitting element) can be suppressed.

In Structural Example 3 and Structural Example 4, the dry agent is provided separately from the sealant, and thus a material for the resin that can be used for the sealant and a material for the dry agent can be selected from a wider range than Structural Example 1 and Structural Example 2.

Note that the structure of a light-emitting device of one embodiment of the present invention is not limited to Structural Examples 1 to 4. For example, a light-emitting device of one embodiment of the present invention may have a structure in which one of the first sealant and the second sealant is the glass layer and the other is the resin layer containing the dry agent, and a dry agent is further provided in the first space.

<Materials that can be Used for Light-Emitting Device of One Embodiment of the Present Invention>

Examples of materials that can be used for the light-emitting device of one embodiment of the present invention will be described below.

[Substrate]

For each of the first substrate 801 and the second substrate 806, a material such as glass, quartz, or an organic resin can be used. The substrate on the side from which light from the light-emitting element is extracted is formed using a material which transmits the light.

In the case where an organic resin is used for the substrate, any of the following can be used as the organic resin, for example: polyester resins such as polyethylene terephthalate (PET) and polyethylene naphthalate (PEN), a polyacrylonitrile resin, a polyimide resin, a polymethylmethacrylate resin, a polycarbonate (PC) resin, a polyethersulfone (PES) resin, a polyamide resin, a cycloolefin resin, a polystyrene resin, a polyamide imide resin, a polyvinylchloride resin, and the like. Further, a substrate in which a glass fiber is impregnated with an organic resin or a substrate in which an inorganic filler is mixed with an organic resin can also be used.

Note that an insulating layer is preferably provided on a surface of the substrate to prevent impurities contained in the substrate from diffusing into elements provided over the substrate.

[Light-Emitting Portion 802]

The light-emitting portion 802 includes an organic EL element as the light-emitting element. The organic EL element includes a layer containing a light-emitting organic compound between a pair of electrodes (an anode and a cathode). A method for driving the organic EL element is not limited, and may be either an active matrix method or a passive matrix method. Further, any of a top emission structure, a bottom emission structure, and a dual emission structure can be used. Specific structure and material of the organic EL element will be described later.

Note that any of a color filter method, a separate coloring method, and a color conversion method may be used for the light-emitting device of one embodiment of the present invention.

[Sealant]

The glass layer used as the sealant can be formed with glass frit, for example. A glass ribbon can also be used. The glass frit or the glass ribbon contains at least a glass material.

The glass frit contains a glass material as a frit material, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one or more kinds of transition metals to absorb infrared light.

In order to form the glass layer with the glass frit, a frit paste is applied over the substrate, for example. The frit paste contains the frit material and a resin (also referred to as a binder) diluted by an organic solvent. The frit paste can be formed using a known material and can have a known structure. For example, terpineol, n-butyl carbitol acetate, or the like can be used as the organic solvent and ethylcellulose or the like can be used as the resin.

An absorber which absorbs light having a wavelength of laser light may be added to the frit material.

Thermal expansion coefficients of the substrate and the glass layer are preferably close to each other. As the thermal expansion coefficients are closer to each other, generation of a crack in the glass layer or the substrate due to thermal stress can be further suppressed.

The resin layer used as the sealant can be formed using a known material including a photocurable resin such as an ultraviolet curable resin, a thermosetting resin, or the like. In particular, a material that is not permeable to moisture or oxygen is preferably used.

In particular, a photocurable resin is preferably used. The organic EL element contains a material with low heat resistance in some cases. A photocurable resin, which is cured by light irradiation, is preferably used because change in film quality and deterioration of the organic EL material itself caused when the organic EL element is heated can be suppressed.

[Dry Agent]

For the dry agent provided in the resin layer or in the first space, a known material can be used. For the dry agent, a substance which adsorbs moisture and the like by chemical adsorption or a substance which adsorbs moisture and the like by physical adsorption can be used. An oxide of an alkali metal, an oxide of an alkaline earth metal (e.g., calcium oxide or barium oxide), sulfate, a metal halide, perchlorate, zeolite, and silica gel can be given as examples thereof.

A method for providing the dry agent in the space is not particularly limited and for example, the dry agent can be provided in the space in the following manner: the space is filled with a filler containing the dry agent, or a drying means including the dry agent is provided (for example, an organic material containing the dry agent is applied, a dish including the dry agent is attached, or powder of the dry agent is applied) over the first substrate or the second substrate.

[Space]

The first space 813 and the second space 811 are, for example, filled with an inert gas such as a rare gas or a nitrogen gas, or an organic resin. Further, the space is in an atmospheric pressure state or a reduced pressure state.

As described above, in the light-emitting device of one embodiment of the present invention, one of the first sealant and the second sealant is the glass layer having excellent productivity and an excellent sealing property, and the other is the resin layer having excellent impact resistance and excellent heat resistance, which is not easily broken by deformation due to external force or the like. In addition, the dry agent is provided in the first space or in the resin layer in the light-emitting device of one embodiment of the present invention. Accordingly, entry of impurities such as moisture or oxygen into the second space can be suppressed.

Thus, in accordance with one embodiment of the present invention, a light-emitting device in which deterioration of an organic EL element due to impurities such as moisture or oxygen is suppressed can be provided.

This embodiment can be combined with any of the other embodiments as appropriate.

Embodiment 2

In this embodiment, a method for manufacturing a light-emitting device, according to one embodiment of the present invention will be described with reference to FIGS. 3A to 3C and FIGS. 4A to 4C. In particular, Structural Example 2 (see FIG. 1B) described in Embodiment 1 will be described as an example.

{First Step: Formation of Light-Emitting Portion}

Figure 3A:
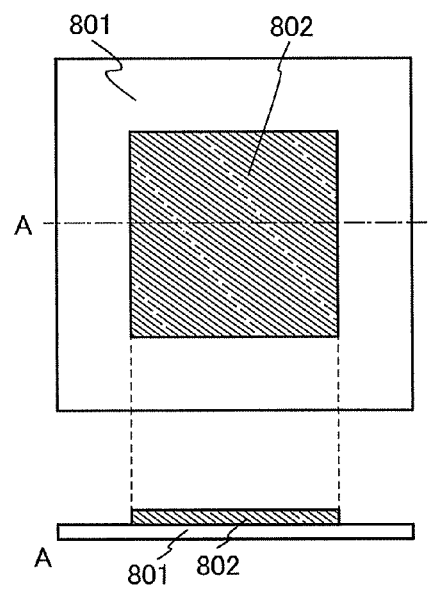
FIGS. 3A to 3C illustrate a method for manufacturing a light-emitting device, according to one embodiment of the present invention.

The light-emitting portion 802 is formed over the first substrate 801 (FIG. 3A). Specifically, the organic EL element, a transistor for controlling light emission of the organic EL element, and the like included in the light-emitting portion 802 are formed. In the case of an active matrix light-emitting device, a driver circuit portion or the like may be provided in addition to the light-emitting portion 802. A structural example of the active matrix light-emitting device will be described in detail in Embodiment 3.

{Second Step: Formation of Sealant 1—Glass Layer—}

Figure 3B:
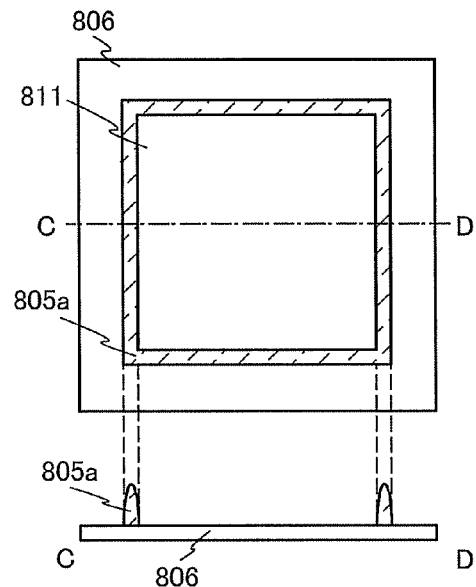

In this embodiment, the glass layer is formed with glass frit. First, a frit paste is formed over the second substrate 806 (FIG. 3B). The frit paste is formed by a printing method such as a screen printing method, or a dispensing method or the like.

Then, the frit paste is heated (pre-baked) to form the first sealant 805a, which is the glass layer. At this time, the heating temperature is preferably close to the glass transition point of a frit material that is used. For example, the heating temperature can be approximately 300° C. to 400° C.

The top surface of the glass layer is preferably flat to increase the adhesion to the first substrate 801. Thus, planarization treatment such as application of pressure may be performed. The planarization treatment can be performed before or after the pre-baking.

The first sealant 805a is provided so as to surround the light-emitting portion 802 when the second substrate 806 is provided to face the first substrate 801.

Note that the glass layer is subjected to laser irradiation (main baking) in a later step (fifth step). A structure in which the light-emitting portion 802 and the first sealant 805a are not in contact with each other after the light-emitting portion 802 is sealed with the first substrate 801, the second substrate 806, and the first sealant 805a in a fourth step is preferable because thermal damage to the light-emitting portion 802 due to the laser irradiation can be suppressed (deterioration of an organic compound or the like contained in the light-emitting portion 802 can be suppressed).

{Third Step: Formation of Sealant 2—Resin Layer—}

Figure 3C:
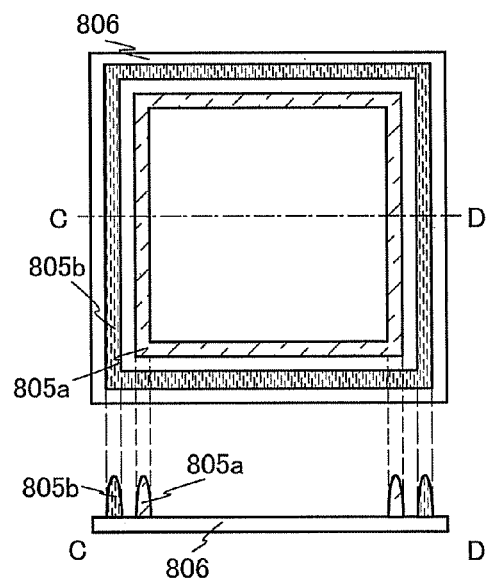

The second sealant 805b is formed over the second substrate 806 so as to surround the first sealant 805a (FIG. 3C). The second sealant 805b is the resin layer containing the dry agent in Structural Example 2.

The second sealant 805b is preferably formed in an inert atmosphere (e.g., a rare gas atmosphere or a nitrogen atmosphere) or under reduced pressure. In the case where the second sealant 805b is formed in an environment where a large amount of impurities such as moisture are contained, e.g., in the air, heat treatment as dehydration treatment is preferably performed after the formation of the second sealant 805b.

In this embodiment, the second sealant 805b is formed using a photocurable resin containing a dry agent in an inert atmosphere.

Note that the glass layer is subjected to laser irradiation in a later step (fifth step). The first sealant 805a and the second sealant 805b are preferably not in contact with each other because thermal damage to the second sealant 805b due to the laser irradiation can be suppressed (deterioration of a resin or the like contained in the second sealant 805b can be suppressed).

In general, heat resistance of an organic compound included in an organic EL element is not high; thus, the glass layer is preferably provided over the second substrate 806 (substrate over which the organic EL element is not formed). In contrast, the photocurable resin may be provided either over the first substrate 801 or over the second substrate 806.

In the case where Structural Example 1 (FIG. 1A) is manufactured, the resin layer containing the dry agent is provided in the third step so as to surround the light-emitting portion 802 and so as to be surrounded by the glass layer (the second sealant 805b).

Further, in the case where Structural Example 3 or 4 (FIG. 2A or 2B) is manufactured, the dry agent is provided in the first space 813 before the fourth step. For example, the dry agent can be provided in a space surrounded by the first sealant 805a and the second sealant 805b after the first sealant 805a and the second sealant 805b are formed over the second substrate 806. Furthermore, in the case where the second space 811 is filled with a filler, the filling is performed before the fourth step.

{Fourth Step: Sealing with Resin Layer}

Figure 4A:
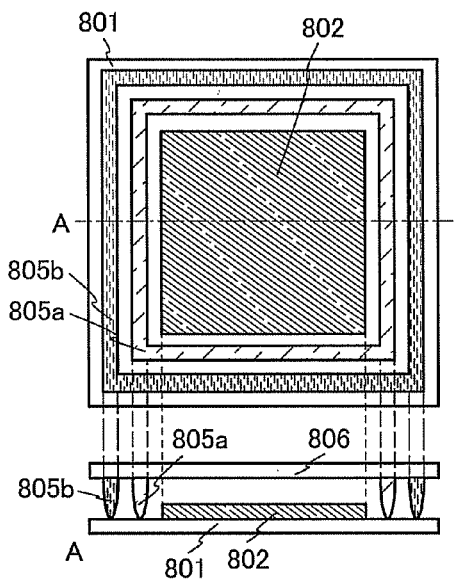
FIGS. 4A to 4C illustrate a method for manufacturing a light-emitting device, according to one embodiment of the present invention.

The first substrate 801 and the second substrate 806 are bonded to each other (FIG. 4A). The first substrate 801 and the second substrate 806 are bonded to each other so that the resin layer (the second sealant 805b) is closely in contact with the substrates.

Figure 4B:
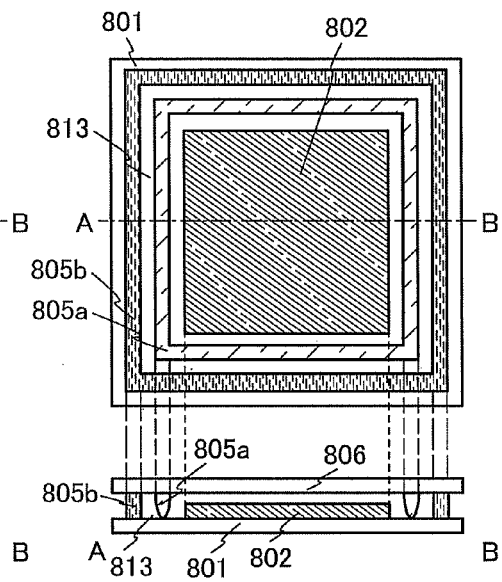

Then, the photocurable resin is irradiated with light so as to be cured, whereby the first space 813, which is a closed space surrounded by the resin layer, the first substrate, and the second substrate, is formed (FIG. 4B).

The light irradiation may be performed from the first substrate 801 side or the second substrate 806 side. Further, a shielding plate is preferably used so that the light-emitting portion 802 and the like are prevented from being irradiated with ultraviolet light.

The above bonding step is performed in an inert atmosphere (e.g., a rare gas atmosphere or a nitrogen atmosphere) or under reduced pressure. Accordingly, impurities such as moisture or oxygen are less likely to be contained in the first space 813 and the second space 811. The bonding step is preferably performed while the external pressure is applied.

In this embodiment, the bonding step is performed under reduced pressure.

{Fifth Step: Sealing with Glass Layer}

Figure 4C:
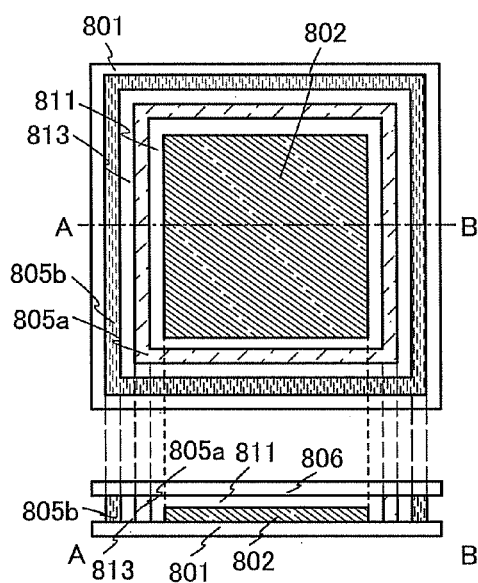

The glass layer is irradiated with laser light, whereby the second space 811, which is a closed space surrounded by the glass layer, the first substrate, and the second substrate, is formed (FIG. 4C). The glass layer is melted by the laser light and is bonded to the first substrate 801 and the second substrate 806 at their respective connection portions. After that, the glass layer is solidified.

The laser light irradiation is preferably performed while the external pressure is applied so that the adhesion between the glass layer (the first sealant 805a) and the first substrate 801, and the adhesion between the glass layer and the second substrate 806 can be improved (a bubble generation from the glass layer can be suppressed). In this embodiment, the laser light irradiation is performed under atmospheric pressure. Since the fourth step (the step of bonding the first substrate 801 and the second substrate 806 to each other) is performed under reduced pressure, the first space 813 and the second space 811 keep their reduced pressure. Thus, the state where pressure is applied to the first substrate 801 and the second substrate 806 by atmospheric pressure is maintained under atmospheric pressure, so that the laser light irradiation can be performed without providing any other pressure application.

The laser light irradiation is preferably performed in the air. When the laser light irradiation is performed in the air, a laser irradiation apparatus is not necessarily provided in a nitrogen atmosphere, a vacuum atmosphere, or the like, whereby a laser irradiation apparatus having a simple structure can be used. At the time when the fourth step is finished, the light-emitting device is sealed with the second sealant, which is the resin layer containing the dry agent, and the pair of substrates. Accordingly, even when the light-emitting device is exposed to the air, entry of impurities such as moisture or oxygen in the air into the light-emitting device can be suppressed.

In general, the sealing property of a glass layer is insufficient before the glass layer is irradiated with laser light. Thus, impurities enter and an organic EL element deteriorates when a light-emitting device is exposed to the air. In contrast, the fourth step is performed in one embodiment of the present invention, so that the organic EL element is sealed with the resin layer containing the dry agent and the pair of substrates. Accordingly, entry of impurities such as moisture or oxygen into the light-emitting element to deteriorate the light-emitting element can be suppressed even when the fifth step is performed in the air.

In this embodiment, the laser light irradiation is performed from the second substrate 806 side. Thus, the second substrate 806 is formed using a material which transmits the laser light. The laser light irradiation can be performed from the first substrate 801 side. However, in the case where a wiring or the like is formed between the first substrate 801 and the glass layer, the glass layer might not be sufficiently irradiated with the laser light. Accordingly, the laser light irradiation is preferably performed from the second substrate 806 side.

As the laser light, laser light having a wavelength which allows the laser light to transmit a substrate on the side irradiated with the laser light and energy which is large enough to heat the glass layer is used. As the laser light, an Nd:YAG laser, a semiconductor laser, or the like is preferably used.

As described above, in accordance with one embodiment of the present invention, a method for manufacturing a light-emitting device in which entry of impurities such as moisture or oxygen is suppressed can be provided.

Modification Examples

Although an example where one light-emitting portion 802 is formed over one first substrate 801 is described in this embodiment, one embodiment of the present invention is not limited thereto. A plurality of the light-emitting portions 802 are formed over the first substrate 801 in the first step, the second to fifth steps are performed, and then the first substrate 801 is divided, so that a plurality of light-emitting devices can be obtained from one first substrate 801.

In the case where the plurality of the light-emitting portions 802 are formed over one first substrate 801 as illustrated in FIGS. 10A1, 10B1, and 10C1, the first sealants 805a (glass layer in FIGS. 10A1, 10A2, 10B1, 10B2, 10C1, and 10C2) are provided so as to surround the respective light-emitting portions 802.

The second sealant 805b (resin layer containing the dry agent in FIGS. 10A1, 10A2, 10B1, 10B2, and 10C1) can be provided so as to surround each of the first sealants 805a as illustrated in FIG. 10A1. Alternatively, adjacent second sealants 805b each surrounding the first sealant 805a may be connected to each other as illustrated in FIG. 10B1.

One embodiment of the present invention is not limited to a structure in which the second sealants 805b surround the respective first sealants 805a. For example, a structure illustrated in FIG. 10C1 can be employed. In FIG. 10C1, the second sealant 805b is provided along the four sides of the first substrate 801 so as to surround all the first sealants 805a.

Each of the modification examples illustrated in FIGS. 10A1, 10B1, and 10C1 can be divided into four light-emitting devices each of which is provided with the light-emitting portion 802. Specifically, each of the four light-emitting devices obtained by dividing the structure in FIG. 10A1 is a light-emitting device illustrated in FIG. 10A2, each of the four light-emitting devices obtained by dividing the structure in FIG. 10B1 is a light-emitting device illustrated in FIG. 10B2, and each of the four light-emitting devices obtained by dividing the structure in FIG. 10C1 is a light-emitting device illustrated in FIG. 10C2.

The structure in FIG. 10A1 is preferable because the division can be easily performed in a region where neither the second substrate 806 nor the second sealant 805b is formed. The structure in FIG. 10B1 is preferable because a wide light-emitting region (area occupied by the light-emitting portion 802 in the substrate) can be obtained compared to the structure in FIG. 10A1.

In the light-emitting device illustrated in FIG. 10C2, which is obtained by dividing the structure in FIG. 10C1 into four light-emitting devices, the light-emitting portion 802 is sealed with the pair of substrates and the first sealant 805a, but not with the second sealant 805b.

However, the light-emitting portion 802 is sealed with the pair of substrates and the first sealant 805a, and with the pair of substrates and the second sealant 805b until the structure in FIG. 10C1 is divided. For example, even in the case where the fourth step is performed under reduced pressure and the fifth step is performed in the air as described above, entry of impurities into the organic EL element is suppressed. As described above, entry of impurities such as moisture or oxygen into the organic EL element in the manufacturing process of the light-emitting device can be suppressed. Thus, it can be said that the light-emitting device illustrated in FIG. 10C2 is an example of a light-emitting device manufactured using the method for manufacturing a light-emitting device, according to one embodiment of the present invention.

The light-emitting device illustrated in FIG. 10C2, in which the light-emitting portion 802 is sealed with the pair of substrates and the first sealant 805a and the second sealant 805b is not included, is preferable because entry of impurities such as moisture or oxygen into the organic EL element in the manufacturing process can be suppressed and the area of the frame can be reduced.

This embodiment can be combined with any of the other embodiments as appropriate.

Embodiment 3

Figure 5A:
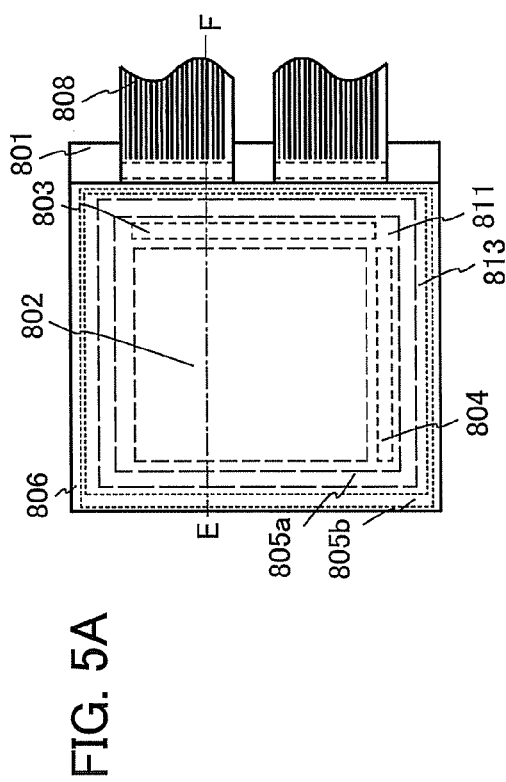
FIGS. 5A and 5B illustrate a light-emitting device of one embodiment of the present invention.
Figure 5B:
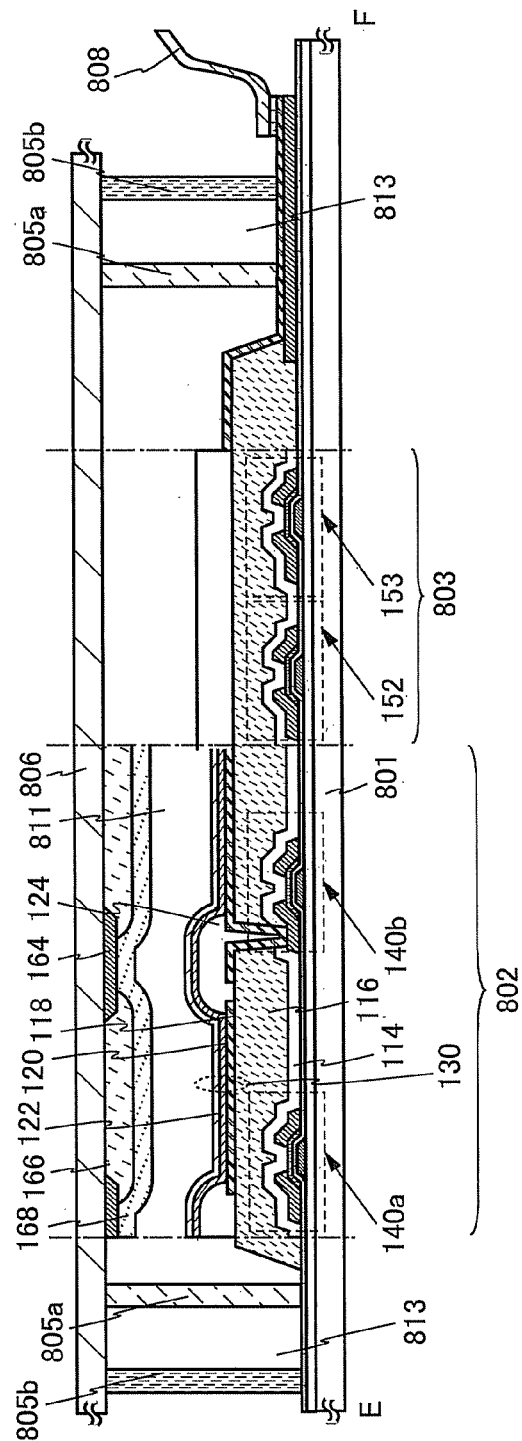

In this embodiment, a light-emitting device of one embodiment of the present invention will be described with reference to FIGS. 5A and 5B. FIG. 5A is a plan view of the light-emitting device of one embodiment of the present invention and FIG. 5B is a cross-sectional view taken along dashed-dotted line E-F in FIG. 5A.

An active matrix light-emitting device according to this embodiment includes, over the first substrate 801, the light-emitting portion 802, a driver circuit portion 803 (gate side driver circuit portion), and a driver circuit portion 804 (source side drive circuit portion). The first sealant 805a is provided so as to surround the light-emitting portion 802, the driver circuit portion 803, and the driver circuit portion 804, and the second sealant 805b is provided so as to surround the first sealant 805a. Thus, the light-emitting portion 802 and the driver circuit portions 803 and 804 are sealed in the second space 811 surrounded by the first substrate 801, the second substrate 806, and the first sealant 805a. Further, the light-emitting portion 802 and the driver circuit portions 803 and 804 are sealed in the first space 813 surrounded by the first substrate 801, the second substrate 806, and the second sealant 805b.

In this embodiment, the first sealant 805a is the glass layer and the second sealant 805b is the resin layer containing the dry agent.

In the light-emitting device of this embodiment, the resin layer is less likely to be separated from the substrate or a crack is less likely to be generated in the resin layer in the manufacturing process or in use of the light-emitting device because the resin layer has excellent impact resistance and excellent heat resistance and is not easily broken by deformation due to external force or the like, so that the effect of sealing the organic EL element with the resin layer is less likely to be reduced.

Thus, even when part of the glass layer is separated from the substrate or a crack is generated in the glass layer or the substrate in the manufacturing process or in use of the light-emitting device and an effect of sealing the light-emitting element with the glass layer is not sufficiently obtained, the effect of sealing the light-emitting element with the resin layer is maintained in the light-emitting device of one embodiment of the present invention.

Further, since the dry agent is contained in the resin layer, entry of impurities such as moisture or oxygen into the second space 811 surrounded by the pair of substrates and the first sealant can be suppressed. As a result, an organic compound or a metal material contained in the organic EL element can be prevented from reacting with impurities such as moisture or oxygen which enter the organic EL element and deteriorating.

Over the first substrate 801, a lead wiring for connecting an external input terminal through which a signal (e.g., a video signal, a clock signal, a start signal, or a reset signal) or a potential from the outside is transmitted to the driver circuit portions 803 and 804 is provided. Here, an example is described in which a flexible printed circuit (FPC) 808 is provided as the external input terminal. Note that a printed wiring board (PWB) may be attached to the FPC 808. In this specification, the light-emitting device includes in its category the light-emitting device itself and the light-emitting device on which the FPC or the PWB is mounted.

The driver circuit portions 803 and 804 include a plurality of transistors. FIGS. 5A and 5B each illustrate an example in which the driver circuit portion 803 includes a CMOS circuit which is a combination of an n-channel transistor 152 and a p-channel transistor 153. A circuit included in the driver circuit portion can be formed using a variety of types of circuits such as a CMOS circuit, a PMOS circuit, or an NMOS circuit. In this embodiment, a driver-integrated type in which a driver circuit and the light-emitting portion are formed over the same substrate is described; however, the present invention is not limited to this structure, and a driver circuit can be formed over a substrate that is different from the substrate over which a light-emitting portion is formed.

The light-emitting portion 802 includes a plurality of light-emitting units each including a switching transistor 140a, a current control transistor 140b, and the first electrode 118 electrically connected to a wiring (a source electrode or a drain electrode) of the current control transistor 140b. Further, an insulating layer 124 is formed so as to cover an end portion of the first electrode 118.

A light-emitting element 130 includes the first electrode 118, a layer containing a light-emitting organic compound (EL layer) 120, and a second electrode 122.

<Materials that can be Used for Light-Emitting Device of One Embodiment of the Present Invention>

Examples of materials that can be used for the light-emitting device of one embodiment of the present invention will be described below. Note that the materials described as examples in Embodiment 1 can be used for the substrate, the sealant, and the dry agent.

[Transistor]

There is no particular limitation on the structure of the transistor (e.g., the transistor 140a, 140b, 152, or 153) used in the light-emitting device of one embodiment of the present invention. A top-gate transistor or a bottom-gate transistor such as inverted staggered transistor may be used. In addition, there is no particular limitation on a material used for the transistor.

A gate electrode can be formed to have a single layer structure or a stacked-layer structure using any of metal materials such as molybdenum, titanium, chromium, tantalum, tungsten, aluminum, copper, neodymium, and scandium, and an alloy material which contains any of these elements, for example.

A gate insulating layer can be formed to have a single layer structure or a stacked-layer structure using any of silicon oxide, silicon nitride, silicon oxynitride, silicon nitride oxide, and aluminum oxide by a plasma CVD method, a sputtering method, or the like, for example.

A semiconductor layer can be formed using a silicon semiconductor or an oxide semiconductor. As the silicon semiconductor, a single crystal silicon semiconductor, a polycrystalline silicon semiconductor, or the like can be used as appropriate. As the oxide semiconductor, In—Ga—Zn—O-based metal oxide or the like can be used as appropriate. Note that the semiconductor layer is preferably formed using an oxide semiconductor which is In—Ga—Zn—O-based metal oxide so as to have low off-state current, in which case an off-state leakage current of the light-emitting element 130 to be formed later can be reduced.

A source electrode layer and a drain electrode layer can be formed using a metal film containing an element selected from Al, Cr, Cu, Ta, Ti, Mo, and W, a metal nitride film containing any of these elements (e.g., a titanium nitride film, a molybdenum nitride film, or a tungsten nitride film), or the like. Alternatively, a film of a high-melting-point metal such as Ti, Mo, or W or a metal nitride film thereof (e.g., a titanium nitride film, a molybdenum nitride film, or a tungsten nitride film) may be formed over or/and below a metal film such as an Al film or a Cu film. Further alternatively, the source electrode layer and the drain electrode layer may be formed using a conductive metal oxide. As the conductive metal oxide, indium oxide ($In_2O_3$ or the like), tin oxide ($SnO_2$ or the like), zinc oxide (ZnO), indium tin oxide (ITO), indium oxide-zinc oxide ($In_2O_3$—ZnO or the like), or any of these metal oxide materials in which silicon oxide is contained can be used.

A first insulating layer 114 has an effect of preventing diffusion of impurities into a semiconductor included in the transistor. As the first insulating layer 114, an inorganic insulating film such as a silicon oxide film, a silicon oxynitride film, or an aluminum oxide film can be used.

As a second insulating layer 116, an insulating film with a planarization function is preferably selected to reduce surface unevenness due to the transistor. For example, an organic material such as polyimide, acrylic, or benzocyclobutene can be used. Other than such organic materials, it is also possible to use a low-dielectric constant material (low-k material) or the like. Note that the second insulating layer 116 may be formed by stacking a plurality of insulating films formed using any of these materials.

[Insulating Layer 124]

The insulating layer 124 is formed so as to cover an end portion of the first electrode 118. The insulating layer 124 preferably has a curved surface with curvature at an upper end portion or a lower end portion thereof to obtain favorable coverage by the second electrode 122 which is to be formed over the insulating layer 124. For example, it is preferable that the upper end portion or the lower end portion of the insulating layer 124 have a curved surface with a radius of curvature (0.2 μm to 3 μm). The insulating layer 124 can be formed using an organic compound such as a negative photosensitive resin or a positive photosensitive resin, or an inorganic compound such as silicon oxide or silicon oxynitride.

[Light-Emitting Element]

The first electrode 118 is provided on the side opposite to a side where light is extracted and is formed using a reflective material. As the reflective material, a metal material such as aluminum, gold, platinum, silver, nickel, tungsten, chromium, molybdenum, iron, cobalt, copper, or palladium can be used. The metal material or an alloy containing the metal material may contain lanthanum, neodymium, or germanium. Besides, an alloy containing aluminum (an aluminum alloy) such as an alloy of aluminum and titanium, an alloy of aluminum and nickel, or an alloy of aluminum and neodymium, or an alloy containing silver such as an alloy of silver and copper can be used. An alloy of silver and copper is preferable because of its high heat resistance.

The EL layer 120 includes at least a layer (light-emitting layer) containing a light-emitting substance. In addition, the EL layer 120 can have a stacked-layer structure in which a layer containing a substance having a high electron-transport property, a layer containing a substance having a high hole-transport property, a layer containing a substance having a high electron-injection property, a layer containing a substance having a high hole-injection property, a layer containing a bipolar substance (substance having a high electron-transport property and a high hole-transport property), and the like are combined as appropriate. Structural examples of the EL layer will be described in detail in Embodiment 4.

As a light-transmitting material for the second electrode 122, indium oxide, ITO, indium oxide-zinc oxide, zinc oxide, zinc oxide to which gallium is added, or the like can be used.

For the second electrode 122, a metal material such as gold, platinum, nickel, tungsten, chromium, molybdenum, iron, cobalt, copper, palladium, or titanium can also be used. A nitride of the metal material (e.g., titanium nitride) or the like may also be used. Graphene or the like may also be used. In the case of using the metal material (or the nitride thereof), the second electrode 122 may be thinned so as to be able to transmit light.

[Color Filter and Black Matrix]

On the second substrate 806, a color filter 166 is provided so as to overlap with the light-emitting element 130. The color filter 166 is provided to control the color of light emitted from the light-emitting element 130. For example, in a full-color display device using white light-emitting elements, a plurality of light-emitting units provided with color filters of different colors are used. In that case, three colors, red (R), green (G), and blue (B), may be used, or four colors, red (R), green (G), blue (B), and yellow (Y), may be used.

A black matrix 164 is provided between the adjacent color filters 166. The black matrix 164 shields a light-emitting unit from light emitted from the light-emitting elements 130 in adjacent light-emitting units and prevents color mixture between the adjacent light-emitting units. Here, the color filter 166 is provided so that its end portion overlaps with the black matrix 164, whereby light leakage can be reduced. The black matrix 164 can be formed using a material that shields light emitted from the light-emitting element 130, for example, a metal or an organic resin. Note that the black matrix 164 may be provided in a region other than the light-emitting portion 802, for example, in the driver circuit portion 803.

An overcoat 168 is formed to cover the color filter 166 and the black matrix 164. The overcoat 168 is formed using a material that transmits light emitted from the light-emitting element 130, and can be an inorganic insulating film or an organic insulating film, for example. Note that the overcoat 168 is not necessarily provided unless needed.

This embodiment can be combined with any of the other embodiments as appropriate.

Embodiment 4

In this embodiment, structural examples of an EL layer which can be used for a light-emitting device of one embodiment of the present invention will be described with reference to FIGS. 6A to 6C.

A known substance can be used for the EL layer, and either a low molecular compound or a high molecular compound can be used. Note that the substance for forming the EL layer includes not only an organic compound but also an inorganic compound in part thereof.

Figure 6A:
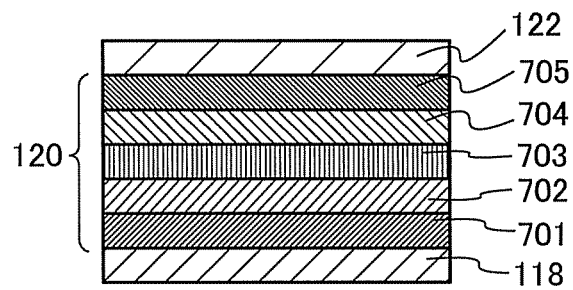
FIGS. 6A to 6C illustrate EL layers of one embodiment of the present invention.

In FIG. 6A, the EL layer 120 is provided between the first electrode 118 and the second electrode 122. In the EL layer 120 in FIG. 6A, a hole-injection layer 701, a hole-transport layer 702, a light-emitting layer 703, an electron-transport layer 704, and an electron-injection layer 705 are stacked in that order from the first electrode 118 side.

Figure 6B:
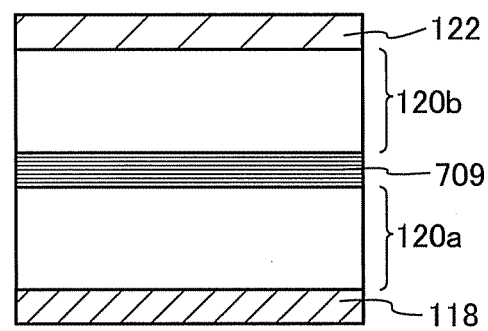

A plurality of EL layers may be stacked between the first electrode 118 and the second electrode 122 as illustrated in FIG. 6B. In that case, a charge generation layer 709 is preferably provided between a first EL layer 120a and a second EL layer 120b which are stacked. A light-emitting element having such a structure is unlikely to suffer the problem of energy transfer, quenching, or the like and gives wider choice of materials, thereby easily having both high light emission efficiency and a long lifetime. Moreover, it is easy to obtain phosphorescence from one EL layer and fluorescence from the other EL layer. This structure can be combined with the above-mentioned structure of the EL layer.

By making the EL layers emit light of different colors from each other, the light-emitting element can provide light emission of a desired color as a whole. For example, by forming a light-emitting element having two EL layers such that the emission color of the first EL layer and the emission color of the second EL layer are complementary colors, the light-emitting element can provide white light emission as a whole. Note that the word "complementary" means color relationship in which an achromatic color is obtained when colors are mixed. In other words, when lights obtained from substances which emit light of complementary colors are mixed, white emission can be obtained. This can be applied to a light-emitting element including three or more EL layers.

Figure 6C:
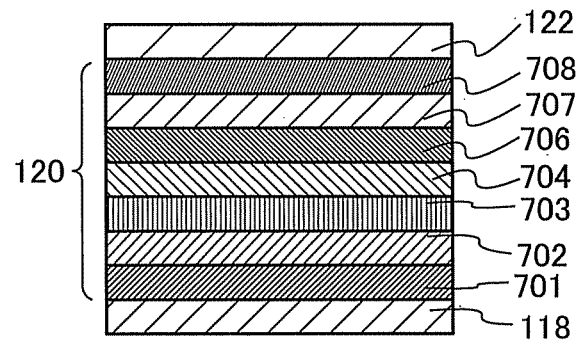

As illustrated in FIG. 6C, the EL layer 120 may include the hole-injection layer 701, the hole-transport layer 702, the light-emitting layer 703, the electron-transport layer 704, an electron-injection buffer layer 706, an electron-relay layer 707, and a composite material layer 708 which is in contact with the second electrode 122, between the first electrode 118 and the second electrode 122.

It is preferable to provide the composite material layer 708 which is in contact with the second electrode 122 because damage caused to the EL layer 120 particularly when the second electrode 122 is formed by a sputtering method can be reduced.

By providing the electron-injection buffer layer 706, an injection barrier between the composite material layer 708 and the electron-transport layer 704 can be reduced; thus, electrons generated in the composite material layer 708 can be easily injected to the electron-transport layer 704.

The electron-relay layer 707 is preferably formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

In the structure in which the electron-relay layer 707 is provided between the composite material layer 708 and the electron-injection buffer layer 706, the acceptor substance contained in the composite material layer 708 and the donor substance contained in the electron-injection buffer layer 706 are less likely to interact with each other, and thus their functions hardly interfere with each other. Accordingly, an increase in driving voltage can be suppressed.

Examples of materials which can be used for each layer will be described below. Note that each layer is not limited to a single layer, and may be a stack of two or more layers.

The hole-injection layer 701 is a layer containing a substance having a high hole-injection property. As the substance having a high hole-injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide; or a phthalocyanine-based compound such as copper(II) phthalocyanine (abbreviation: CuPc) can be used.

Any of the following aromatic amine compounds which are low molecular organic compounds can also be used: 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: LiNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

A high molecular compound can also be used. Examples of the high molecular compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide]

(abbreviation: PTPDA), and poly[N,N'-bis(4-butylphenyl)-N,N'-bis(phenyl)benzidine] (abbreviation: Poly-TPD). A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), can also be used.

In particular, for the hole-injection layer 701, a composite material in which an acceptor substance is mixed with an organic compound having a high hole-transport property is preferably used. With the use of the composite material in which an acceptor substance is mixed with a substance having a high hole-transport property, excellent hole-injection from the first electrode 118 can be obtained, which results in a reduction in driving voltage of the light-emitting element. Such a composite material can be formed by co-evaporation of a substance having a high hole-transport property and an acceptor substance. When the hole-injection layer 701 is formed using the composite material, holes are easily injected from the first electrode 118 into the EL layer 120.

The organic compound for the composite material is preferably a substance having a hole mobility of $10^{-6}$ cm$^2$/V·s or higher. Note that other than the above substances, any substance that has a property of transporting more holes than electrons may be used. The organic compounds which can be used for the composite material will be specifically shown below.

Examples of the organic compound that can be used for the composite material are aromatic amine compounds, such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP); and carbazole derivatives, such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Other examples of the organic compound that can be used are aromatic hydrocarbon compounds, such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Other examples of the organic compound that can be used are aromatic hydrocarbon compounds, such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

A high molecular compound such as PVK, PVTPA, PTPDMA, or Poly-TPD can also be used.

Examples of the electron acceptor are organic compounds, such as 7,7,8,8-tetracyano-2,3,5,6-tetrafluoroquinodimethane (abbreviation: F$_4$-TCNQ) and chloranil; oxides of transition metals; and oxides of metals that belong to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron accepting properties. Among these metal oxides, molybdenum oxide is especially preferable because it is stable in the air, has a low hygroscopic property, and is easily handled.

The hole-transport layer 702 is a layer containing a substance having a high hole-transport property. As the substance having a high hole-transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly ones that have a hole mobility of $10^{-6}$ cm$^2$/V·s or higher. Note that other than the above substances, any substance that has a property of transporting more holes than electrons may be used.

For the hole-transport layer 702, a carbazole derivative such as CBP, CzPA, or PCzPA; an anthracene derivative such as t-BuDNA, DNA, or DPAnth; or a high molecular compound such as PVK, PV PTPDMA, or Poly-TPD can also be used.

For the light-emitting layer 703, a fluorescent compound which exhibits fluorescence or a phosphorescent compound which exhibits phosphorescence can be used.

Examples of the fluorescent compound that can be used for the light-emitting layer 703 are the following light-emitting materials: materials that emit blue light, such as N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA); materials that emit green light, such as N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N''-triphenyl-1,4-phenylenediamine (abbreviation: 2DPAPA), N-[9,10-bis(1,1'-biphenyl-2-yl)-2-anthryl]-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA); materials that emit yellow light, such as rubrene and 5,12-bis(1,1'-biphenyl-4-yl)-6,11-diphenyltetracene (abbreviation: BPT); and materials that emit red light, such as N,N,N',N'-tetrakis(4-methylphenyl)tetracene-5,11-diamine (abbreviation: p-mPhTD) and 7,14-diphenyl-N,N,N',N'-tetrakis(4-methylphenyl)acenaphtho[1,2-α]fluoranthene-3,10-diamine (abbreviation: p-mPhAFD).

Examples of the phosphorescent compound that can be used for the light-emitting layer 703 are the following light-emitting materials: materials that emit blue light, such as bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III)picolinate (abbreviation: Ir(CF$_3$ppy)$_2$(pic)), and bis[2-(4',6'-difluorophenyl)pyridinato-N,C$^{2'}$]iridium(III)acetylacetonate (abbreviation: FIr(acac)); materials that emit green light, such as tris(2-phenylpyridinato-N,C$^{2'}$)iridium(III) (abbreviation: Ir(ppy)$_3$), bis(2-phenylpyridinato-N,C$^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$); materials that emit yellow light, such as bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis[2-(4-methoxyphenyl)-3,5-dimethylpyrazinato]iridium(III) (abbreviation: Ir(dmmoppr)$_2$(acac)); materials that emit orange light, such as tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)); and materials that emit red light, for example, organometallic complexes, such as bis[2-(2'-benzo[4,5-α]thienyl)pyridinato-N,C$^{3'}$)iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), and (2,3,7,8,12,13,17,18-octaethyl-21H,23H-porphyrin)platinum(II) (abbreviation: PtOEP). Further, rare-earth metal complexes, such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare-earth metal ions (electron transition between different multiplicities), and thus can be used as phosphorescent compounds.

Note that the light-emitting layer 703 may have a structure in which any of the above-described light-emitting organic compounds (a light-emitting substance or a guest material) is dispersed in another substance (a host material). As the host material, a variety of kinds of materials can be used, and it is preferable to use a substance which has a lowest unoccupied molecular orbital level (LUMO level) higher than that of the guest material and has a highest occupied molecular orbital level (HOMO level) lower than that of the guest material.

Specific examples of the host material that can be used are the following materials: metal complexes, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds, such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), 9,10-diphenylanthracene (abbreviation: DPAnth), and 6,12-dimethoxy-5,11-diphenylchrysene; aromatic amine compounds, such as N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB; and the like.

A plurality of kinds of materials can be used as the host material. For example, in order to suppress crystallization, a substance such as rubrene which suppresses crystallization may be further added. In addition, NPB, Alq, or the like may be further added to efficiently transfer energy to the guest material.

With a structure in which a guest material is dispersed in a host material, crystallization of the light-emitting layer 703 can be suppressed. Further, concentration quenching due to high concentration of the guest material can be suppressed.

For the light-emitting layer 703, a high molecular compound can be used. Specific examples of a material that emits blue light are poly(9,9-dioctylfluorene-2,7-diyl) (abbreviation: PFO), poly[(9,9-dioctylfluorene-2,7-diyl)-co-(2,5-dimethoxybenzene-1,4-diyl)](abbreviation: PF-DMOP), poly {(9,9-dioctylfluorene-2,7-diyl)-co-[N,N'-di-(p-butylphenyl)-1,4-diaminobenzene]}(abbreviation: TAB-PFH), and the like. Specific examples of a material that emits green light are poly(p-phenylenevinylene) (abbreviation: PPV), poly[(9,9-dihexylfluorene-2,7-diyl)-alt-co-(benzo[2,1,3]thiadiazole-4,7-diyl)](abbreviation: PFBT), poly[(9,9-dioctyl-2,7-divinylenefluorenylene)-alt-co-(2-methoxy-5-(2-ethylhexyloxy)-1,4-phenylene)], and the like. Specific examples of a material that emits orange to red light are poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenylamino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]}(abbreviation: CN-PPV-DPD), and the like.

By providing a plurality of light-emitting layers and making the emission colors of the layers different from each other, light emission of a desired color can be obtained from the light-emitting element as a whole. For example, by forming a light-emitting element having two light-emitting layers such that the emission color of the first light-emitting layer and the emission color of the second light-emitting layer are complementary colors, the light-emitting element can provide white light emission as a whole. This can be applied to a light-emitting element having three or more light-emitting layers.

The electron-transport layer 704 is a layer containing a substance having a high electron-transport property. As the substance having a high electron-transport property, for example, a metal complex having a quinoline skeleton or a benzoquinoline skeleton, such as Alq, Almq$_3$, BeBq$_2$, or Balq can be used. Alternatively, it is possible to use a metal complex having an oxazole-based ligand or a thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$). Further alternatively, instead of a metal complex, it is possible to use PBD, OXD-7, TAZ, Bphen, BCP, or the like. The substances mentioned here are mainly ones that have an electron mobility of $10^{-6}$ cm$^2$/V·s or higher.

The electron-injection layer 705 is a layer containing a substance having a high electron-injection property. For the electron-injection layer 705, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. Any of the above substances for forming the electron-transport layer 704 can also be used.

Note that the hole-injection layer 701, the hole-transport layer 702, the light-emitting layer 703, the electron-transport layer 704, and the electron-injection layer 705 which are described above can each be formed by a method such as an evaporation method (e.g., a vacuum evaporation method), an inkjet method, or a coating method.

The charge generation layer 709 illustrated in FIG. 6B can be formed using the above-mentioned composite material. Further, the charge generation layer 709 may have a stacked-layer structure including a layer containing the composite material and a layer containing another material. In that case, as the layer containing another material, a layer containing an electron donating substance and a substance having a high electron-transport property, a layer formed using a transparent conductive film, or the like can be used.

The composite material layer 708 illustrated in FIG. 6C can be formed using the above-described composite material in which an acceptor substance is mixed with an organic compound having a high hole-transport property.

For the electron-injection buffer layer 706, a substance having a high electron-injection property, such as an alkali metal, an alkaline earth metal, a rare earth metal, or a compound of the above metal (including an oxide such as lithium oxide, a halide, and a carbonate such as lithium carbonate or cesium carbonate) can be used.

Further, in the case where the electron-injection buffer layer 706 contains a substance Shaving a high electron-transport property and a donor substance, the donor substance is preferably added so that the mass ratio of the donor substance to the substance having a high electron-transport property is in the range from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (including an oxide such as lithium oxide, a halide, and a carbonate such as lithium carbonate or cesium carbonate). Note that as the substance having a high electron-transport property, a material similar to the material for the electron-transport layer 704 described above can be used.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is controlled so as to be located between the LUMO level of the acceptor substance contained in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably higher than or equal to −5.0 eV, more preferably higher than or equal to −5.0 eV and lower than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, specifically, any of CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc), is preferably used.

As the metal complex having a metal-oxygen bond and an aromatic ligand, which is contained in the electron-relay layer 707, a metal complex having a metal-oxygen double bond is preferably used. The metal-oxygen double bond has an acceptor property (a property of easily accepting electrons); thus, electrons can be transferred (donated and accepted) more easily.

As a metal complex having a metal-oxygen bond and an aromatic ligand, a phthalocyanine-based material is preferable. Specifically, vanadyl phthalocyanine (VOPc), a phthalocyanine tin(IV) oxide complex (SnOPc), or a phthalocyanine titanium oxide complex (TiOPc) is preferable because a metal-oxygen double bond is more likely to act on another molecule in terms of a molecular structure and an acceptor property is high.

Note that as the phthalocyanine-based material described above, phthalocyanine-based material having a phenoxy group is preferable. Specifically, a phthalocyanine derivative having a phenoxy group, such as PhO-VOPc, is preferable. The phthalocyanine derivative having a phenoxy group is soluble in a solvent and therefore has the advantage of being easy to handle during formation of a light-emitting element and the advantage of facilitating maintenance of an apparatus used for film formation.

The electron-relay layer 707 may further contain a donor substance. As the donor substance, an organic compound such as TTN, nickelocene, or decamethylnickelocene can be used as well as an alkali metal, an alkaline earth metal, a rare earth metal, and a compound of the above metal (including an oxide such as lithium oxide, a halide, and a carbonate such as lithium carbonate or cesium carbonate). When such a donor substance is contained in the electron-relay layer 707, electrons can be transferred easily and the light-emitting element can be driven at lower voltage.

In the case where a donor substance is contained in the electron-relay layer 707, in addition to the materials described above, a substance having a LUMO level higher than the acceptor level of the acceptor substance contained in the composite material layer 708 can be used as the substance having a high electron-transport property. Specifically, it is preferable to use a substance having a LUMO level higher than or equal to −5.0 eV, preferably higher than or equal to −5.0 eV and lower than or equal to −3.0 eV. Examples of such a substance are a perylene derivative and a nitrogen-containing condensed aromatic compound. Note that a nitrogen-containing condensed aromatic compound is preferably used for the electron-relay layer 707 because of its stability.

Specific examples of the perylene derivative are 3,4,9,10-perylenetetracarboxylic dianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

Specific examples of the nitrogen-containing condensed aromatic compound are pirazin[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8,8-pentadecafluoroodyl)-1,4,5,8-naphthalenetetracar boxylic diimide (abbreviation: NTCDI-C8F), 3',4'-dibutyl-5,5"-bis(dicyanomethylene)-5,5"-dihydro-2,2':5',2"-terthiophene (abbreviation: DCMT), methanofullerenes (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property, and the donor substance.

In the above manner, the EL layer in this embodiment can be formed.

This embodiment can be freely combined with any of the other embodiments.

Embodiment 5

In this embodiment, with reference to FIGS. 7A to 7E, FIG. 8, and FIGS. 9A to 9C, description is given of examples of a variety of electronic devices and lighting devices that are each completed by use of a light-emitting device of one embodiment of the present invention.

In the light-emitting device of one embodiment of the present invention, deterioration of an organic EL element due to impurities such as moisture or oxygen is suppressed. Thus, highly reliable electronic device and lighting device can be obtained by application of the light-emitting device of one embodiment of the present invention.

Examples of the electronic devices to which the light-emitting device is applied are a television device (also referred to as television or television receiver), a monitor of a computer or the like, a camera such as a digital camera or a digital video camera, a digital photo frame, a mobile phone (also referred to as cellular phone or cellular phone device), a portable game machine, a portable information terminal, an audio reproducing device, and a large-sized game machine such as a pachinko machine. Specific examples of these electronic devices and a lighting device are illustrated in FIGS. 7A to 7E, FIG. 8, and FIGS. 9A to 9C.

Figure 7A:
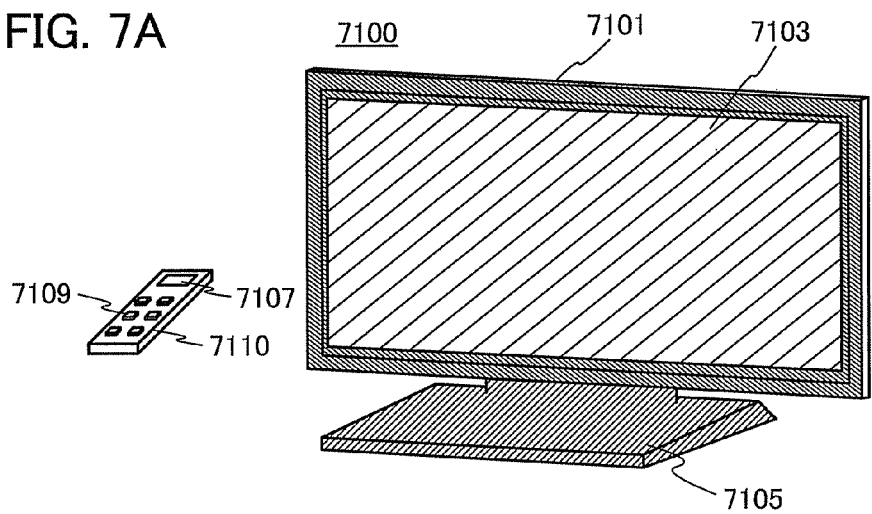
FIGS. 7A to 7E illustrate electronic devices of one embodiment of the present invention.

FIG. 7A illustrates an example of a television device. In a television device 7100, a display portion 7103 is incorporated in a housing 7101. The display portion 7103 is capable of displaying images, and the light-emitting device of one embodiment of the present invention can be used for the display portion 7103. A highly reliable television device can be obtained by using the light-emitting device of one embodiment of the present invention for the display portion 7103. Here, the housing 7101 is supported by a stand 7105.

Operation of the television device 7100 can be performed with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the receiver, a general television broadcast can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 7B:
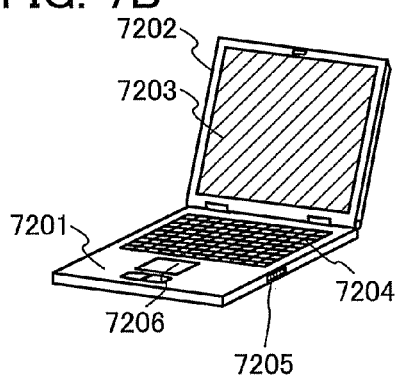

FIG. 7B illustrates a computer having a main body 7201, a housing 7202, a display portion 7203, a keyboard 7204, an external connection port 7205, a pointing device 7206, and the like. Note that this computer is manufactured using the light-emitting device of one embodiment of the present invention for the display portion 7203. A highly reliable computer can be obtained by using the light-emitting device of one embodiment of the present invention for the display portion 7203.

Figure 7C:
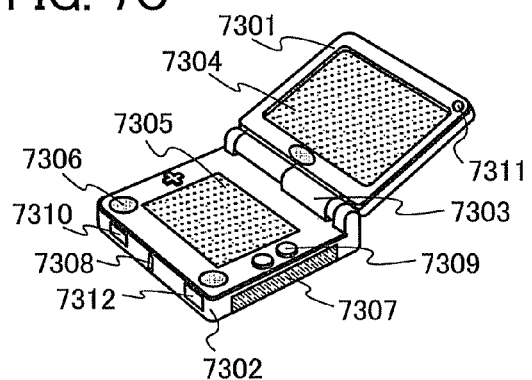

FIG. 7C illustrates a portable game machine having two housings, a housing 7301 and a housing 7302, which are connected with a joint portion 7303 so that the portable game machine can be opened or folded. A display portion 7304 is incorporated in the housing 7301, and a display portion 7305 is incorporated in the housing 7302. In addition, the portable game machine illustrated in FIG. 7C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the light-emitting device of one embodiment of the present invention is used for at least one of the display portion 7304 and the display portion 7305, and may include other accessories as appropriate. A highly reliable portable game machine can be obtained by using the light-emitting device of one embodiment of the present invention for the display portion 7304 and/or the display portion 7305. The portable game machine illustrated in FIG. 7C has a function of reading out a program or data stored in a storage medium to display it on the display portion, and a function of sharing information with another portable game machine by wireless communication. The portable game machine illustrated in FIG. 7C can have a variety of functions without limitation to the above.

Figure 7D:
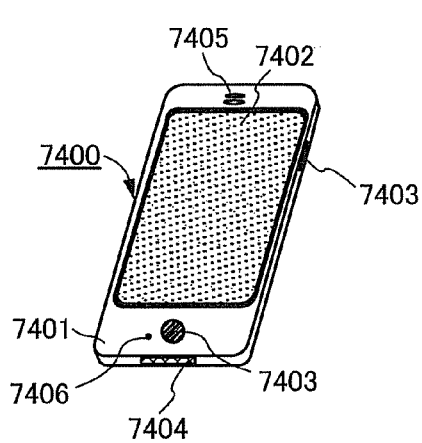

FIG. 7D illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using the light-emitting device of one embodiment of the present invention for the display portion 7402. A highly reliable mobile phone can be obtained by using the light-emitting device of one embodiment of the present invention for the display portion 7402.

When the display portion 7402 of the mobile phone 7400 illustrated in FIG. 7D is touched with a finger or the like, data can be input into the mobile phone 7400. Further, operations such as making a call and composing an e-mail can be performed by touching the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on the screen can be inputted. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically switched by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. The screen modes can also be switched depending on the kind of image displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken when the display portion 7402 is touched with the palm or the finger, whereby personal authentication can be performed. Further, by providing a backlight or a sensing light source which emits near-infrared light in the display portion, an image of a finger vein, a palm vein, or the like can be taken.

Figure 7E:
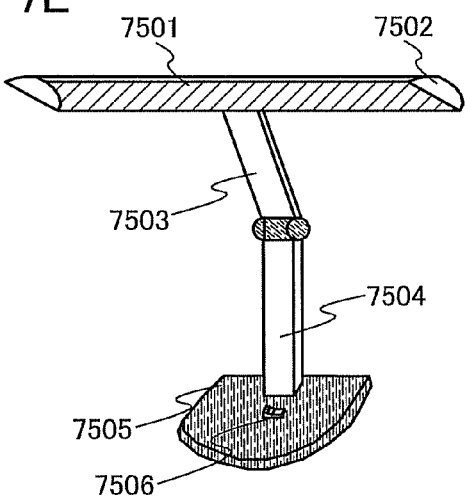

FIG. 7E illustrates a desk lamp, which includes a lighting portion 7501, a shade 7502, an adjustable arm 7503, a support 7504, a base 7505, and a power switch 7506. The desk lamp is manufactured using the light-emitting device of one embodiment of the present invention for the lighting portion 7501. A highly reliable desk lamp can be obtained by using the light-emitting device of one embodiment of the present invention for the display portion 7501. Note that the "lighting device" also includes ceiling lights, wall lights, and the like.

Figure 8:
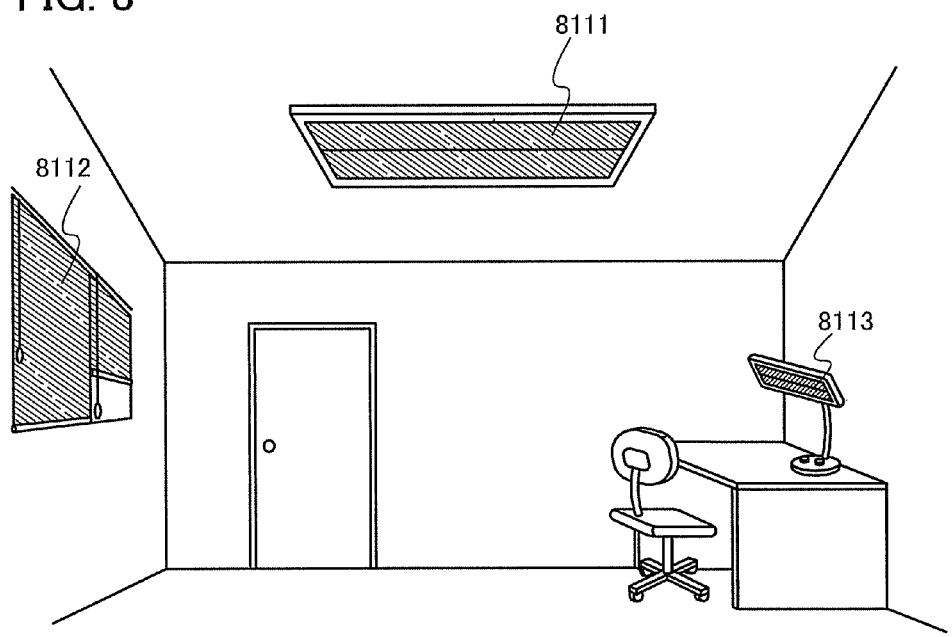
FIG. 8 illustrates lighting devices of one embodiment of the present invention.

FIG. 8 illustrates an example in which the light-emitting device of one embodiment of the present invention is used for an interior lighting device 8111. Since the light-emitting device of one embodiment of the present invention can have a larger area, it can be used as a large-area lighting device. Furthermore, the light-emitting device can be used as a roll-type lighting device 8112. As illustrated in FIG. 8, a desk lamp 8113 described with reference to FIG. 7E may also be used in a room provided with the interior lighting device 8111.

Figure 9A:
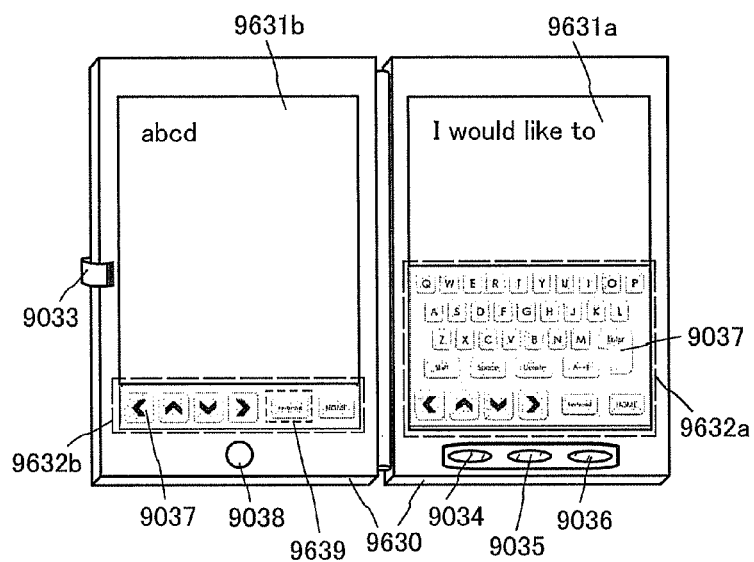
FIGS. 9A to 9C illustrate an electronic device of one embodiment of the present invention.
Figure 9B:
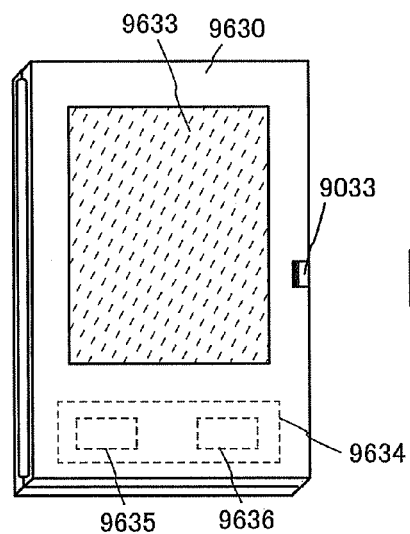

FIGS. 9A and 9B illustrate a foldable tablet terminal. The tablet terminal is opened in FIG. 9A. The tablet terminal includes a housing 9630, a display portion 9631a, a display portion 9631b, a display mode switch 9034, a power switch 9035, a power saver switch 9036, a clasp 9033, and an operation switch 9038.

The light-emitting device of one embodiment of the present invention can be applied to the display portion 9631a or the display portion 9631b.

Part of the display portion 9631a can be a touch panel region 9632a and data can be input when a displayed operation key 9037 is touched. Although a structure in which a half region in the display portion 9631a has only a display function and the other half region also has a touch panel function is shown as an example, the display portion 9631a is not limited to the structure. The whole region in the display portion 9631a may have a touch panel function. For example, the display portion 9631a can display keyboard buttons in the whole region to be a touch panel, and the display portion 9631b can be used as a display screen.

Similarly to the display portion 9631a, part of the display portion 9631b can be a touch panel region 9632b. A switching button 9639 for showing/hiding a keyboard of the touch panel is touched with a finger, a stylus, or the like, so that keyboard buttons can be displayed on the display portion 9631b.

Touch input can be performed in the touch panel region 9632a and the touch panel region 9632b at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. Another detection device including a sensor for detecting inclination, such as a gyroscope or an acceleration sensor, may be incorporated in the tablet terminal, in addition to the optical sensor.

Note that FIG. 9A shows an example in which the display portion 9631a and the display portion 9631b have the same display area; however, without limitation thereon, one of the display portions may be different from the other display portion in size and display quality. For example, one display panel may be capable of higher-definition display than the other display panel.

The tablet terminal is closed in FIG. 9B. The tablet terminal includes the housing 9630, a solar cell 9633, a charge and discharge control circuit 9634, a battery 9635, and a DCDC converter 9636. In FIG. 9B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

In addition, the tablet terminal illustrated in FIGS. 9A and 9B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633 provided on a surface of the tablet terminal can supply power to the touch panel, the display portion, a video signal processing portion, or the like. Note that a structure in which the solar cell 9633 is provided on one or two surfaces of the housing 9630 is preferable to charge the battery 9635 efficiently. When a lithium ion battery is used as the battery 9635, there is an advantage of downsizing or the like.

Figure 9C:
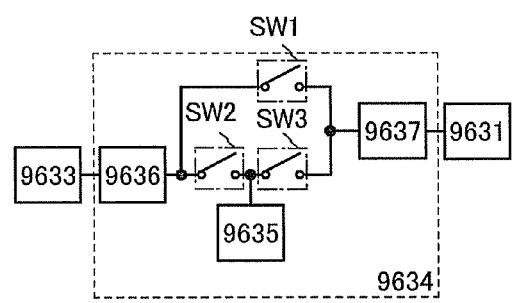

The structure and the operation of the charge and discharge control circuit 9634 illustrated in FIG. 9B will be described with reference to a block diagram in FIG. 9C. The solar cell 9633, the battery 9635, the DCDC converter 9636, a converter 9637, switches SW1 to SW3, and the display portion 9631 are illustrated in FIG. 9C, and the battery 9635, the DCDC converter 9636, the converter 9637, and the switches SW1 to SW3 correspond to the charge and discharge control circuit 9634 illustrated in FIG. 9B.

First, an example of the operation in the case where power is generated by the solar cell 9633 using external light is described. The voltage of power generated by the solar battery is raised or lowered by the DCDC converter 9636 so that the power has a voltage for charging the battery 9635. Then, when the power from the solar cell 9633 is used for the operation of the display portion 9631, the switch SW1 is turned on and the voltage of the power is raised or lowered by the converter 9637 so as to be a voltage needed for the display portion 9631. In addition, when display on the display portion 9631 is not performed, the switch SW1 is turned off and the switch SW2 is turned on so that charge of the battery 9635 may be performed.

Note that the solar cell 9633 is described as an example of a power generation means; however, without limitation thereon, the battery 9635 may be charged using another power generation means such as a piezoelectric element or a thermoelectric conversion element (Peltier element). For example, a non-contact electric power transmission module which transmits and receives power wirelessly (contactlessly) to charge the battery 9635, or a combination of the solar cell 9633 and another means for charge may be used.

As described above, electronic devices and lighting devices can be obtained by application of the light-emitting device of one embodiment of the present invention. The light-emitting device of one embodiment of the present invention has a remarkably wide application range, and can be applied to electronic devices in a variety of fields.

Note that the structure described in this embodiment can be combined with the structure described in any of the above embodiments as appropriate.

Example 1

In this example, a light-emitting device of one embodiment of the present invention will be described with reference to FIGS. 11A to 11D, FIGS. 12A to 12C, and FIGS. 13A1, 13A2, 13B1, 13B2, 13C1, 13C2, 13D1, and 13D2.

In this example, a light-emitting device of one embodiment of the present invention and a light-emitting device of a comparative example were fabricated. In the light-emitting device of one embodiment of the present invention, a glass layer 1053a and a resin layer 1053b containing a dry agent were used as sealants. In the light-emitting device of the comparative example, only, the glass layer 1053a was used as a sealant.

First, a method for manufacturing the light-emitting device of one embodiment of the present invention will be described.
{First Step: Formation of Light-Emitting Portion}

Figure 11A:
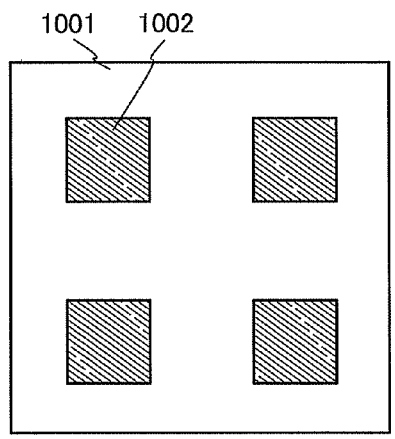
FIGS. 11A to 11D illustrate a light-emitting device in Example.

First, light-emitting portions 1002 were formed over a first substrate 1001 (FIG. 11A). In this example, four light-emitting portions 1002 were formed over the first substrate 1001. FIG. 11C is a cross-sectional view of one of the light-emitting portions 1002.

Specifics are as follows: a 300-nm-thick silicon oxynitride film was formed as a base film 1011; a 100-nm-thick titanium film, a 600-nm-thick aluminum film, and a 200-nm-thick titanium film were stacked as an extraction electrode 1013; a 200-nm-thick silicon oxide film was formed as an insulating film 1015; a 200-nm-thick aluminum-nickel alloy film containing lanthanum and a 6-nm-thick titanium film were stacked as a first electrode 1017 of an organic EL element; a 1.5-μm-thick polyimide film was formed as a partition 1019 covering an end portion of the first electrode 1017; an EL layer 1021 was formed over the first electrode 1017; and a 15-nm-thick magnesium-silver alloy film and a 70-nm-thick indium tin oxide film were stacked as a second electrode 1023 over the EL layer 1021.
{Second Step: Formation of Sealant}

Figure 11B:
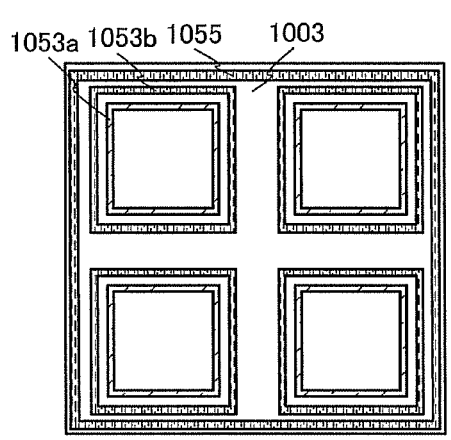
Figure 11C:
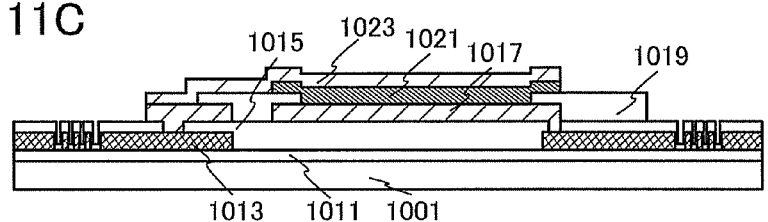

The glass layer 1053a and the resin layer 1053b containing the dry agent were formed over a second substrate 1003 (FIG. 11B).

Specifically, a frit paste was formed over the second substrate 1003 by a screen printing method. As the frit paste, a glass paste containing bismuth oxide or the like was used.

Then, drying was performed at 140° C. for 20 minutes.

Next, an organic solvent and a resin in the frit paste were removed by laser light irradiation to form the glass layer 1053a, which is a first sealant. The laser light irradiation was performed under the following conditions: a semiconductor laser with a wavelength of 940 nm was used, the output power was 15 W, and the scanning speed was 1 mm/sec.

After the second substrate 1003 was washed, heat treatment was performed at 200° C. under atmospheric pressure for 60 minutes. Then, the second substrate 1003 was put in a bonding apparatus and heat treatment was performed at 170° C. under reduced pressure for 30 minutes.

Next, the resin layer 1053b containing the dry agent, which is a second sealant, was formed so as to surround the glass layer 1053a. Here, a photocurable resin containing zeolite was used. At that time, a resin layer 1055 for temporal fixing was also formed along the periphery of a surface of the second substrate 1003 over which the glass layer 1053a was formed.
{Third Step: Sealing with Resin Layer}

The first substrate 1001 and the second substrate 1003 were bonded to each other while force of 0.6 kN was applied under reduced pressure (pressure of 100 Pa) so that the substrates were closely in contact with the resin layer 1053b.

Then, the resin layer 1053b and the resin layer 1055 were irradiated with ultraviolet light so that the resin layer 1053b and the resin layer 1055 were cured. After that, heat treatment was performed at 80° C. for 60 minutes. The ultraviolet light irradiation was performed from the second substrate 1003 side.
{Fourth Step: Sealing with Glass Layer}

The light-emitting device sealed with the resin layer was taken out from the bonding apparatus and then, the glass layer 1053a was irradiated with laser light under atmospheric pressure. Accordingly, glass was melted to be bonded to the first substrate 1001 and the second substrate 1003 at their respective connection portions.

The laser light irradiation was performed under the following conditions: a semiconductor laser with a wavelength of 940 nm was used, the output power was 8 W, and the scanning speed was 1 mm/sec. The laser light irradiation was performed from the second substrate 1003 side.

Figure 11D:
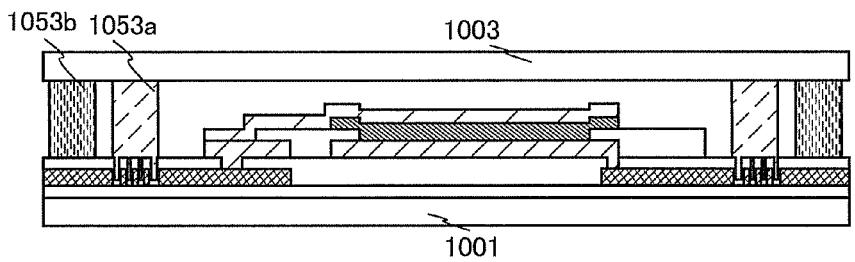

FIG. 11D is a cross-sectional view illustrating that one light-emitting portion 1002 is sealed with the first substrate 1001, the second substrate 1003, the glass layer 1053a, and the resin layer 1053b containing the dry agent.

Figure 12A:
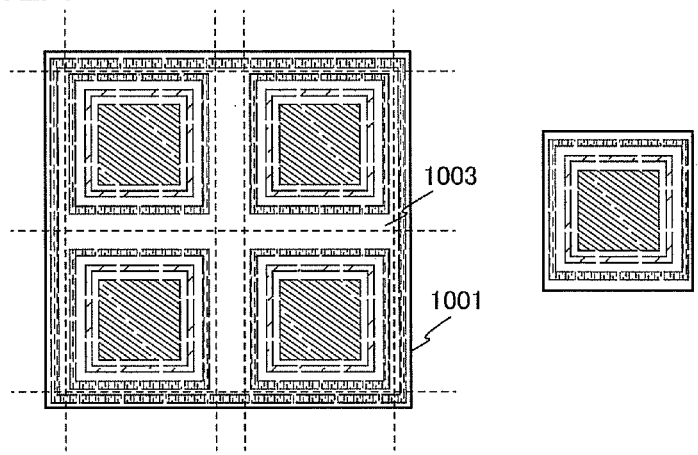
FIGS. 12A to 12C illustrate light-emitting devices in Example.

The first substrate 1001 was divided along dotted lines in FIG. 12A, whereby four light-emitting devices of one embodiment of the present invention were obtained.

Next, a method for manufacturing the light-emitting device of the comparative example will be described.

A first step, formation of the glass layer 1053a in a second step, and a fourth step were performed to manufacture the light-emitting device of the comparative example, in a manner similar to that of the light-emitting device of one embodiment of the present invention. In the second step, only the resin layer 1055 for temporal fixing was formed. In a third step, the resin layer 1055 was cured. A formation method, a curing method, and the like, of the resin layer 1055 were similar to those of the light-emitting device of one embodiment of the present invention.

Figure 12B:
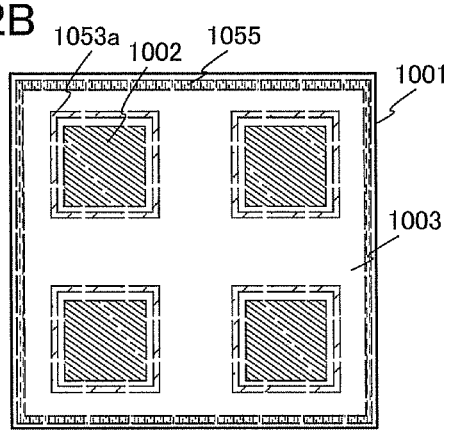
Figure 12C:
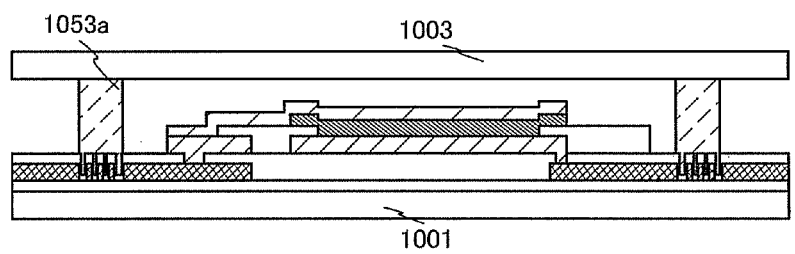

FIG. 12B is a plan view of the fabricated light-emitting device of the comparative example (before divided into four), and FIG. 12C is a cross-sectional view illustrating that one light-emitting portion 1002 is sealed with the first substrate 1001, the second substrate 1003, and the glass layer 1053a.

Then, the light-emitting device of one embodiment of the present invention and the light-emitting device of the comparative example were subjected to a preservation test. Specifically, the light-emitting devices were preserved in a thermostatic bath maintained at a temperature of 65° C. and a humidity of 90%, and light emission was observed at room temperature an atmosphere maintained at 25° C.) after a certain period of time.

FIGS. 13A1, 13B1, and 13C1 are photographs showing light emission of the light-emitting device of one embodiment of the present invention before the preservation test, after preservation for 500 hours, and after preservation for 1000 hours, respectively.

FIGS. 13A2, 13B2, and 13C2 are photographs showing light emission of the light-emitting device of the comparative example before the preservation test, after preservation for 500 hours, and after preservation for 1000 hours, respectively.

FIG. 13D1 is a photograph of a sealing portion (the glass layer 1053a and the resin layer 1053b) of the light-emitting device of one embodiment of the present invention, and FIG. 13D2 is a photograph of a sealing portion (the glass layer 1053a) of the light-emitting device of the comparative example.

As shown in FIGS. 13A1, 13B1, and 13C1, in the light-emitting device of one embodiment of the present invention, light emission that was equivalent to that before the preservation test was observed even after preservation for 1000 hours.

In contrast, as shown in FIGS. 13A2, 13B2, and 13C2, in the light-emitting device of the comparative example, the entire light-emitting portion emitted light with substantially the same luminance before the preservation test; however, light emission in an end portion of the light-emitting portion was darker than that in the central portion after preservation for 500 hours. Accordingly, it is found that shrinkage of the light-emitting portion (here, luminance degradation from the end portion of the light-emitting portion, or an increase in non-light-emitting region in the light-emitting portion) occurs. In addition, the shrinkage of the light-emitting portion progressed after preservation for 1000 hours.

As a cause of the shrinkage of the light-emitting portion, entry of impurities such as moisture or oxygen into the light-emitting portion (specifically, into the organic EL element) can be given. For example, impurities remaining in the substrate may be released by the heat treatment in the second step or the like and may enter the light-emitting portion. Since the light-emitting device is in the air after sealing with the resin layer is performed, atmospheric components may enter the light-emitting device, or even the light-emitting portion before sealing with the glass layer is performed. For another example, impurities contained in the glass layer may be released at the time of the laser light irradiation or the like and enter the light-emitting portion. Atmospheric components may enter the light-emitting device not only during the manufacturing process but also after the manufacturing process, depending on the degree of sealing of the light-emitting device.

The light-emitting device of one embodiment of the present invention includes the resin layer containing the dry agent as the sealant, whereby the effect of sealing the organic EL element can be increased as compared to the case where only the glass layer is used as the sealant. For example, when impurities remaining in the light-emitting device or impurities having entered the light-emitting device are adsorbed, entry of the impurities into the organic EL element can be suppressed. Further, the adhesion between the substrates of the light-emitting device can be increased and thus entry of atmospheric components into the light-emitting device can be suppressed.

The above results indicate that deterioration of the organic EL element can be suppressed in the light-emitting device of one embodiment of the present invention, which is sealed with the glass layer and the resin layer containing the dry agent, as compared to the light-emitting device of the comparative example, which is sealed with only the glass layer.

EXPLANATION OF REFERENCE

114: first insulating layer, 116: second insulating layer, 118: first electrode, 120: EL layer, 120a: first EL layer, 120b: second EL layer, 122: second electrode, 124: insulating layer, 130: light-emitting element, 140a: transistor, 140b: transistor, 152: transistor, 153: transistor, 164: black matrix, 166: color filter, 168: overcoat, 701: hole-injection layer, 702: hole-transport layer, 703: light-emitting layer, 704: electron-transport layer, 705: electron-injection layer, 706: electron-injection buffer layer, 707: electron-relay layer, 708: composite material layer, 709: charge generation layer, 801: first substrate, 802: light-emitting portion, 803: driver circuit portion, 804: driver circuit portion, 805a: first sealant, 805b: second sealant, 805c: first sealant, 805d: second sealant, 806: second substrate, 811: second space, 813: first space, 815: dry agent, 1001: first substrate, 1002: light-emitting portion, 1003: second substrate, 1011: base film, 1013: extraction electrode, 1015: insulating film, 1017: first electrode, 1019: partition, 1021: EL layer, 1023: second electrode, 1053a: glass layer, 1053b: resin layer, 1055: resin layer, 7100: television device, 7101: housing, 7103: display portion, 7105: stand, 7107: display portion, 7109: operation key, 7110: remote controller, 7201: main body, 7202: housing, 7203: display portion, 7204:

keyboard, 7205: external connection port, 7206: pointing device, 7301: housing, 7302: housing, 7303: connection portion, 7304: display portion, 7305: display portion, 7306: speaker portion, 7307: recording medium insertion portion, 7308: LED lamp, 7309: operation key, 7310: connection terminal, 7311: sensor, 7312: microphone, 7400: mobile phone, 7401: housing, 7402: display portion, 7403: operation button, 7404: external connection port, 7405: speaker, 7406: microphone, 7501: lighting portion, 7502: shade, 7503: adjustable arm, 7504: support, 7505: base, 7506: power switch, 8111: lighting device, 8112: lighting device, 8113: desk lamp, 9033: clasp, 9034: switch, 9035: power switch, 9036: switch, 9037: operation key, 9038: operation switch, 9630: housing, 9631: display portion, 9631a: display portion, 9631b: display portion, 9632a: region, 9632b: region, 9633: solar cell, 9634: charge and discharge control circuit, 9635: battery, 9636: DCDC converter, 9637: converter, and 9639: button.

This application is based on Japanese Patent Application serial no. 2011-184779 filed with Japan Patent Office on Aug. 26, 2011, the entire contents of which are hereby incorporated by reference.

The invention claimed is:

1. A light-emitting device comprising:
a first substrate and a second substrate facing each other;
a light-emitting element over the first substrate;
an electrode electrically connected to the light-emitting element;
an insulating film over the electrode;
a first sealant surrounding the light-emitting element; and
a second sealant surrounding the first sealant,
wherein the first sealant is over and in direct contact with the electrode,
wherein the second sealant is over and in direct contact with the insulating film,
wherein the light-emitting element comprises a layer containing a light-emitting organic compound between a pair of electrodes,
wherein one of the first sealant and the second sealant is a glass layer,
wherein the other of the first sealant and the second sealant is a resin layer,
wherein a dry agent is included in a first space surrounded by the first sealant, the second sealant, the first substrate, and the second substrate,
wherein the first space comprises a rare gas,
wherein the light-emitting element is provided in a second space surrounded by the first sealant, the first substrate, and the second substrate,
wherein the dry agent and the second sealant are spaced from each other with a gap, and
wherein the dry agent and one of the first substrate and the second substrate are spaced from each other with a gap.

2. The light-emitting device according to claim 1, wherein the second space is under reduced pressure.

3. The light-emitting device according to claim 1, wherein the first sealant is the glass layer and the second sealant is the resin layer.

4. The light-emitting device according to claim 1, wherein the resin layer comprises a photocurable resin.

5. An electronic device comprising the light-emitting device according to claim 1 in a display portion.

6. A lighting device comprising the light-emitting device according to claim 1 in a light-emitting portion.

7. A display module comprising the light-emitting device according to claim 1, comprising a flexible printed circuit (FPC).

8. A light-emitting device comprising:
a first substrate and a second substrate facing each other;
a light-emitting element over the first substrate;
an electrode electrically connected to the light-emitting element;
an insulating film over the electrode;
a first sealant surrounding the light-emitting element; and
a second sealant surrounding the first sealant,
wherein the first sealant is over and in direct contact with the electrode,
wherein the second sealant is over and in direct contact with the insulating film,
wherein the light-emitting element comprises a layer containing a light-emitting organic compound between a pair of electrodes,
wherein one of the first sealant and the second sealant is a glass layer,
wherein the other of the first sealant and the second sealant is a resin layer,
wherein a first dry agent is included in a first space surrounded by the first sealant, the second sealant, the first substrate, and the second substrate,
wherein the first space comprises a rare gas,
wherein the resin layer comprises a second dry agent,
wherein the light-emitting element is provided in a second space surrounded by the first sealant, the first substrate, and the second substrate,
wherein the first dry agent and the second sealant are spaced from each other with a gap, and
wherein the first dry agent and one of the first substrate and the second substrate are spaced from each other with a gap.

9. The light-emitting device according to claim 8, wherein the second space is under reduced pressure.

10. The light-emitting device according to claim 8, wherein the first sealant is the glass layer and the second sealant is the resin layer.

11. The light-emitting device according to claim 8, wherein the resin layer comprises a photocurable resin.

12. An electronic device comprising the light-emitting device according to claim 8 in a display portion.

13. A lighting device comprising the light-emitting device according to claim 8 in a light-emitting portion.

14. A display module comprising the light-emitting device according to claim 8, comprising a flexible printed circuit (FPC).

* * * * *

UNITED STATES PATENT AND TRADEMARK OFFICE
CERTIFICATE OF CORRECTION

PATENT NO. : 9,258,853 B2
APPLICATION NO. : 13/591445
DATED : February 9, 2016
INVENTOR(S) : Yusuke Nishido and Shunpei Yamazaki It is certified that error appears in the above-identified patent and that said Letters Patent is hereby corrected as shown below:

In the Specification:

Column 4, Line 54; Change "a fit paste" to --a frit paste--.

Column 20, Line 55; Change "LiNTPD)," to --DNTPD),--.

Column 21, Line 1; Change "PTPDA)," to --PTPDMA),--.

Column 21, Line 32; Change "N,N-bis" to --N,N'-bis--.

Column 21, Line 39; Change "3[4-(" to --3-[4-(--.

Column 22, Line 27; Change "PVK, PV PTPDMA," to --PVK, PVTPA, PTPDMA,--.

Column 22, Line 46; Change "anthryl]-triphenyl" to --anthryl]-N,N',N'-triphenyl--.

Column 24, Line 56 to 57; Change "diphenyl amino" to --diphenyl-amino--.

Column 25, Line 54; Change "Shaving" to --having--.

Column 26, Line 47; Change "above, phthalocyanine-based" to --above, a phthalocyanine-based--.

Column 27, Line 20; Change "pirazin[" to --pirazino[--.

Column 27, Line 30; Change "pentadecafluoroodyl)" to --pentadecafluorooctyl)--.

Column 27, Line 31; Change "naphthalenetetracar boxylic" to --naphthalenetetracarboxylic--.

Column 27, Line 39; Change "property, and" to --property and--.

Column 32, Line 3; Change "only, the" to --only the--.

Column 33, Line 39; Change "temperature an atmosphere maintained" to --temperature (in an atmosphere maintained--.

Signed and Sealed this
Fourteenth Day of June, 2016

Michelle K. Lee
*Director of the United States Patent and Trademark Office*